(12) United States Patent
Song

(10) Patent No.: US 9,035,372 B2
(45) Date of Patent: May 19, 2015

(54) NONVOLATILE MEMORY DEVICE, FABRICATION METHOD THEREOF AND MEMORY SYSTEM COMPRISING THE SAME

(71) Applicants: SK HYNIX INC., Icheon (KR); Industry-University Cooperation Foundation Hanyang University, Seoul (KR)

(72) Inventor: Yun Hevb Song, Seongnam (KR)

(73) Assignees: SK HYNIX INC., Icheon (KR); INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 84 days.

(21) Appl. No.: 13/931,333

(22) Filed: Jun. 28, 2013

(65) Prior Publication Data

US 2014/0001530 A1 Jan. 2, 2014

(30) Foreign Application Priority Data

Jun. 29, 2012 (KR) .......... 10-2012-0071329

(51) Int. Cl.
| | |
|---|---|
| H01L 29/792 | (2006.01) |
| H01L 29/78 | (2006.01) |
| H01L 29/66 | (2006.01) |
| H01L 27/115 | (2006.01) |

(52) U.S. Cl.
CPC .......... *H01L 29/78* (2013.01); *H01L 29/66833* (2013.01); *H01L 29/7926* (2013.01); *H01L 27/11582* (2013.01)

(58) Field of Classification Search
None
See application file for complete search history.

(56) References Cited

U.S. PATENT DOCUMENTS

2011/0180941 A1* 7/2011 Hwang et al. ................. 257/786

FOREIGN PATENT DOCUMENTS

| KR | 10-2010-0050790 A | 5/2010 |
|---|---|---|
| KR | 10-2010-0107661 A | 10/2010 |
| KR | 10-2011-0132817 A | 12/2011 |

OTHER PUBLICATIONS

H. Tanaka et al., "Bit Cost Scalable Technology with Punch and Plug Process for Ultra High Density Flash Memory", Symposium on VLSI Technology Digest of Technical Papers, 2007, pp. 14-15, Toshiba Corporation, Yokohama Kanagawa, Japan.

Ryota Katsumata et al., "Pipe-shaped BiCS Flash Memory with 16 Stacked Layers and Multi-Level-Cell Operation for Ultra High Density Storage Devices", Symposium on VLSI Technology Digest of Technical Papers, 2009, pp. 136-137, Toshiba Coporation, Yokohama, Japan.

Jaehoon Jang et al., "Vertical Cell Array using TCAT(Terabit Cell Array Transistor) Technology for Ultra High Density NAND Flash Memory", Symposium on VLSI Technology Digest of Technical Papers, 2009, pp. 192-193, Samsung Electronics Co., Ltd., Yongin-City, Korea.

\* cited by examiner

*Primary Examiner* — Sonya D McCall Shepard

(57) ABSTRACT

A nonvolatile memory device includes (i) a semiconductor substrate, (ii) a channel formed over the substrate and extending in a first direction, (iii) a first NAND string arranged over a lower portion of a sidewall of the channel, (iv) a second NAND string arranged over an upper portion of the sidewall of the channel, and (v) an erasing conductive layer provided between the first and the second NAND strings and coupled to the sidewall of the channel.

18 Claims, 20 Drawing Sheets

NONVOLATILE MEMORY DEVICE, FABRICATION METHOD THEREOF AND MEMORY SYSTEM COMPRISING THE SAME

CROSS-REFERENCE TO RELATED APPLICATION

The present application claims priority of Korean Patent Application No. 10-2012-0071329, filed on Jun. 29, 2012, which is incorporated herein by reference in its entirety.

BACKGROUND

1. Field

Exemplary embodiments relate to a nonvolatile memory device in which a channel of a memory cell transistor is formed vertically, a fabrication method thereof, and a memory system comprising the same. According to embodiments, when at least two NAND strings are repeatedly made by alternately stacking an insulating layer and a conductive gate layer, a bulk layer made of a conductive semiconductor material is formed between the NAND strings so that it can be used for an erase operation, and vertical layers in the NAND strings are connected to each other in a self-aligned manner. In addition, a fabrication method for this structure is also disclosed. Thus, an erase operation is performed by the bulk layer, and the interference between the bulk layer and the channel layer is minimized.

2. Description of the Related Art

As semiconductor technology has rapidly developed for several decades, the degree of integration of semiconductor memories has greatly increased. Among these memories, non-volatile semiconductor memories have made a market comparable to DRAMs due to the recent popularization of mobile devices. Particularly, among non-volatile memories, NAND flash memories are prevalent. It was difficult to improve the degree of integration of NAND flash memories, because cells that store binary information are adjacent to each other and spread horizontally. In the year 2010, a semiconductor device having a line width of 20 nm (nano-meter) was also developed. However, because the size of the device is decreased due to an increase in the degree of integration, the physical and electrical properties of the device may be deteriorated.

Flash memories typically have a structure in which a floating gate and a control gate are stacked. The flash memories are programmed by injecting electric charges into the floating gate and erased by causing the injected electric charges to escape. However, in recently developed technologies, flash memories are arranged on a semiconductor substrate vertically rather than horizontally in order to overcome the limitation on the density of integration.

In the year 2007, Toshiba Corporation (Japan) presented a flash memory including a vertical channel and a composite insulating layer of SONOS (Silicon-Oxide-Nitride-Oxide-Substrate) as a charge trap layer instead of a double-gate structure, as disclosed in an article entitled "Bit Cost Scalable Technology with Punch and Plug Process for Ultra High Density Flash Memory" (hereinafter referred to as 'BiCS technology'). See H. Tanaka et al., 2007 Symposium on VLSI Technology, sec 2-2, pages 14-15, which is incorporated by reference in its entirety herein for all purposes. At the 2009 Symposium on VLSI Technology (R. Katsumata et al., sec. 7-1, pages 136-137), Toshiba Corporation (Japan) presented at an article entitled "Pipe-shaped BiCS Flash Memory with 16 Stacked Layers and Multi-Level-Cell Operation for Ultra High Density Storage Devices" (hereinafter referred to as 'P-BiCS technology') which is also incorporated by reference in its entirety herein for all purposes. Meanwhile, Samsung presented a flash memory having a vertical channel, in an article entitled "Vertical Cell Array using TCAT (Terabit Cell Array Transistor) Technology for Ultra High Density NAND Flash Memory" (hereinafter referred to as 'TCAT technology'), presented at the 2009 Symposium on VLSI Technology. (J. Jang et al., sec. 10A-4, pages 192-193). These articles are herewith incorporated by reference in their entireties herein.

However, in these technologies, as a number of vertically stacked NAND strings increases, various problems arise. For example, the BiCS technology or the P-BiCS technology employs a GIDL (Gate Induced Drain Leakage) in a lower select transistor connected to the NAND string on the semiconductor substrate during an erase operation, and in this case, erase efficiency decreases as a number of memory cells connected to the NAND string increases. Particularly, this issue becomes more prevalent in the memory cells which are located farther from the select transistor and also acts as a factor of limiting vertical stacking.

Another issue that may be associated with the TCAT technology is that an erase voltage should be applied to the substrate so that the erase voltage influences all the memory cells of the NAND string in order to perform an erase operation. In this case, an erase bias is applied through the channel region of each transistor, and thus a voltage difference is produced between the channel layer of the memory cell adjacent to the substrate and the channel layer of the memory cell located farthest from the substrate. This is because of resistivity of the channel region. For this reason, there are problems in that erase efficiency changes depending on a position of the memory cell and in that a number of memory cells which can be stacked is also limited. These problems become more severe as a number of stacked memory cells in the NAND string increases, and reduce cost competitiveness of a vertical channel-type nonvolatile memory product.

SUMMARY

An embodiment is directed to a structure in which an erasing bulk layer made of a conductive semiconductor material is formed between stacked memory cells in a vertical channel-type nonvolatile semiconductor memory, a fabrication method thereof, and a memory system including the same.

An embodiment is directed to various methods for minimizing an interference phenomenon that occurs between an erasing bulk layer and memory cells during an erase operation in a nonvolatile memory device.

An embodiment is directed to minimizing error during the access of binary information in an electronic device including the inventive nonvolatile memory device having an erasing bulk layer to allow a more reliable operation.

In accordance with an embodiment, a nonvolatile memory device may comprise: a semiconductor substrate; a first NAND string extending in a first direction and comprising a plurality of memory cells, wherein the first NAND string includes (i) repeatedly stacked structure of an interlayer insulating layer and a conductive gate layer over the semiconductor substrate, (ii) a gate insulating layer and a composite insulating layer formed over a sidewall of the repeatedly stacked structure, and (iii) a channel layer extending in the first direction which is perpendicular to an upper surface of the semiconductor substrate; a second NAND string formed over the first NAND string and extending in the first direction;

an erasing bulk layer located between the first NAND string and the second NAND string and including a conductive semiconductor material; and a protrusion extending from the channel layer in a second direction different from the first direction and coupled to the erasing conductive gate layer.

Each of the first and the second NAND strings may include a select transistor for selecting the memory cells. The select transistor may be connected in series with the memory cells. A switching transistor may be formed (i) between the erasing bulk layer and the first NAND strings and/or (ii) between the erasing bulk layer and the second NAND strings.

A shielding nitride film may be formed (i) between the erasing bulk layer and the first NAND strings and/or (ii) between the erasing bulk layer and the second NAND strings. A thickness of the interlayer insulating layer insulating the erasing bulk layer may be thicker than a thickness of the interlayer insulating layer insulating the conductive gate layer. The select transistor may be coupled to a bit line.

In accordance with an embodiment, a nonvolatile memory device may comprises: a semiconductor substrate; a first NAND string extending in a first direction and comprising (i) a first stack including an interlayer insulating layer and a conductive gate layer and formed over the semiconductor substrate, (ii) a first composite insulating layer formed in the first direction and further formed over a sidewall of a first space created by patterning the first stack, and (iii) a first channel layer filled in the first space; an erasing conductive gate layer provided over the first NAND string; a second NAND string extending in the first direction, provided over the erasing conductive gate layer, and including (i) a second stack including a second interlayer insulating layer and a second conductive gate layer and formed over the first NAND string, (ii) a second composite insulating layer formed in the first direction and further formed over a sidewall of a second space created by patterning the second stack, and (iii) a second channel layer filled in the second space; and a protrusion extending from between the first and the second channel layers in a second direction and coupled to the erasing conductive gate layer.

The first channel layer and the second channel layer may be coupled to each other. The erasing conductive layer may have a doping concentration higher than the first channel layer and the second channel layer. Any of the first composite insulating layer and the second composite insulating layer may include nitride.

Any of the first composite insulating layer and the second composite insulating layer may be configured to store data. The first space and the second space are formed by using substantially the same photomask.

In accordance with an embodiment, a nonvolatile memory device may comprise: a semiconductor substrate; a channel formed over the substrate and extending in a first direction; a first NAND string arranged over a lower portion of a sidewall of the channel; a second NAND string arranged over an upper portion of the sidewall of the channel; and an erasing conductive layer provided between the first and the second NAND strings and coupled to the sidewall of the channel.

The device may further comprise: a protrusion extending from the sidewall of the channel to between the first and the second NAND strings. The erasing conductive layer may be coupled to the protrusion.

The device may further comprise: a select transistor provided between (i) the erasing conductive layer and (ii) the first or the second NAND strings. Each of the first and the second NAND strings may include a plurality of control gates coupled to the channel via a plurality of charge trap layers, respectively.

A thickness of a first interlayer insulating layer for the erasing conductive layer may be thicker than a thickness of a second interlayer insulating layer for insulating the plurality of control gates from each other. The plurality of control gates and the plurality of charge trap layers may extend in a second direction perpendicular to the first direction.

In accordance with an embodiment, a method for fabricating a nonvolatile memory device may comprise: (a) forming a first stack by repeatedly stacking a first interlayer insulating layer and a second conductive gate layer over a semiconductor substrate; (b) forming a first space by etching a portion of the first stack; (c) forming a first charge trap layer over a sidewall of the first space; (d) filling a first channel layer in the first space; (e) forming a second stack by repeatedly forming a second interlayer insulating layer and a second conductive gate layer over the first stack; (f) forming a second space by etching a portion of the second stack; (g) forming a second charge trap layer over a sidewall of the second space; and (h) filling a second channel layer in the second space, wherein a protrusion extending from a portion of the first channel layer toward the first conductive gate layer is formed in step (d).

The first space and the second space may be formed in a self-aligned manner. The first conductive gate layer may comprise a memory cell gate which stores data, and a control gate. The first channel and the second channel are coupled to each other.

Any of the first charge storage film and the second charge storage film may include a nitride film. Each of the first charge trap layer and the second charge trap layer may comprise a stack including an oxide film and a nitride film. The method may further comprise planarizing the first stack after filling the first channel layer.

In accordance with an embodiment, a memory system may comprise at least one memory controller and at least one nonvolatile memory device, the nonvolatile memory device comprising: a first NAND string having a first vertical channel and a repeating stack including an insulating layer and a conductive gate layer formed over a semiconductor substrate; an erasing bulk layer formed over the first NAND string; a second NAND string having a second vertical channel and a repeating stack including an insulating layer and a conductive gate layer formed over the erasing bulk layer; and a protrusion extending from any of the first and the second vertical channels toward the erasing bulk layer.

The memory system may include a memory card. The memory card may comprise the nonvolatile memory device and the memory controller. The memory controller and the nonvolatile memory device may be configured to communicate an address, a command, and data.

In accordance with an embodiment, a nonvolatile memory device includes: a first NAND string including a plurality of memory cells, in which the first NAND string is formed by repeatedly stacking an interlayer insulating layer and a conductive gate layer over a semiconductor substrate, forming an insulating film on the sidewall of the repeatedly stacked layers and forming a channel layer in a direction perpendicular to the substrate; a second NAND string formed on the first NAND string in the same manner as the first NAND string; and an erasing conductive gate layer located between the first NAND string and the second NAND string, wherein a portion of the channel layer, which comes into contact with the erasing conductive gate layer, protrudes toward the erasing conductive gate layer.

In accordance with an embodiment, a nonvolatile memory device includes: a first NAND string including a first stack formed by repeatedly stacking an interlayer insulating layer and a conductive gate layer over a semiconductor substrate, a first composite insulating layer formed vertically in a first space created by etching the first stack, and a first channel layer filled in the first space; an erasing conductive gate layer stacked over the first NAND string; and a second NAND string including a second stack formed by repeatedly stacking an interlayer insulating layer and a conductive gate layer over the first NAND string, a second composite insulating layer formed vertically in a second space created by etching the second stack, and a second channel layer filled in the second space, wherein the first channel layer or the second channel layer has a protrusion extending toward the erasing conductive gate layer.

In accordance with an embodiment, a method for fabricating a nonvolatile memory device having an erasing bulk layer include: forming a first stack by repeatedly stacking an interlayer insulating layer and a conductive gate layer over a semiconductor substrate; etching a portion of the first stack to form a first space; forming a first charge storage film on the sidewall of the portion defining the first space; filling a first channel layer in the first space; forming a second stack by repeatedly forming an interlayer insulating layer and a conductive gate layer over the first stack; etching a portion of the second stack to form a second space; forming a second charge storage film on the sidewall of the portion defining the second space; and filling a second channel layer in the second space, wherein a protrusion extending from a portion of the first channel layer toward the conductive gate layer is formed when filling the first channel layer in the first space.

In accordance with an embodiment, a memory system includes at least one memory controller and at least one nonvolatile memory device, the nonvolatile memory device including: a first NAND string having a first vertical channel and formed by repeatedly stacking an insulating layer and a conductive gate layer over a semiconductor substrate; an erasing bulk layer formed over the first NAND string; and a second NAND string having a second vertical channel and formed by repeatedly stacking an insulating layer and a conductive gate layer over the erasing bulk layer, wherein the first or second vertical channel has a protrusion extending toward the erasing bulk layer.

BRIEF DESCRIPTION OF THE DRAWINGS

FIG. 12b shows the results of testing the voltage-current characteristics of the structures shown in FIG. 12a.

DETAILED DESCRIPTION

Figure 1:
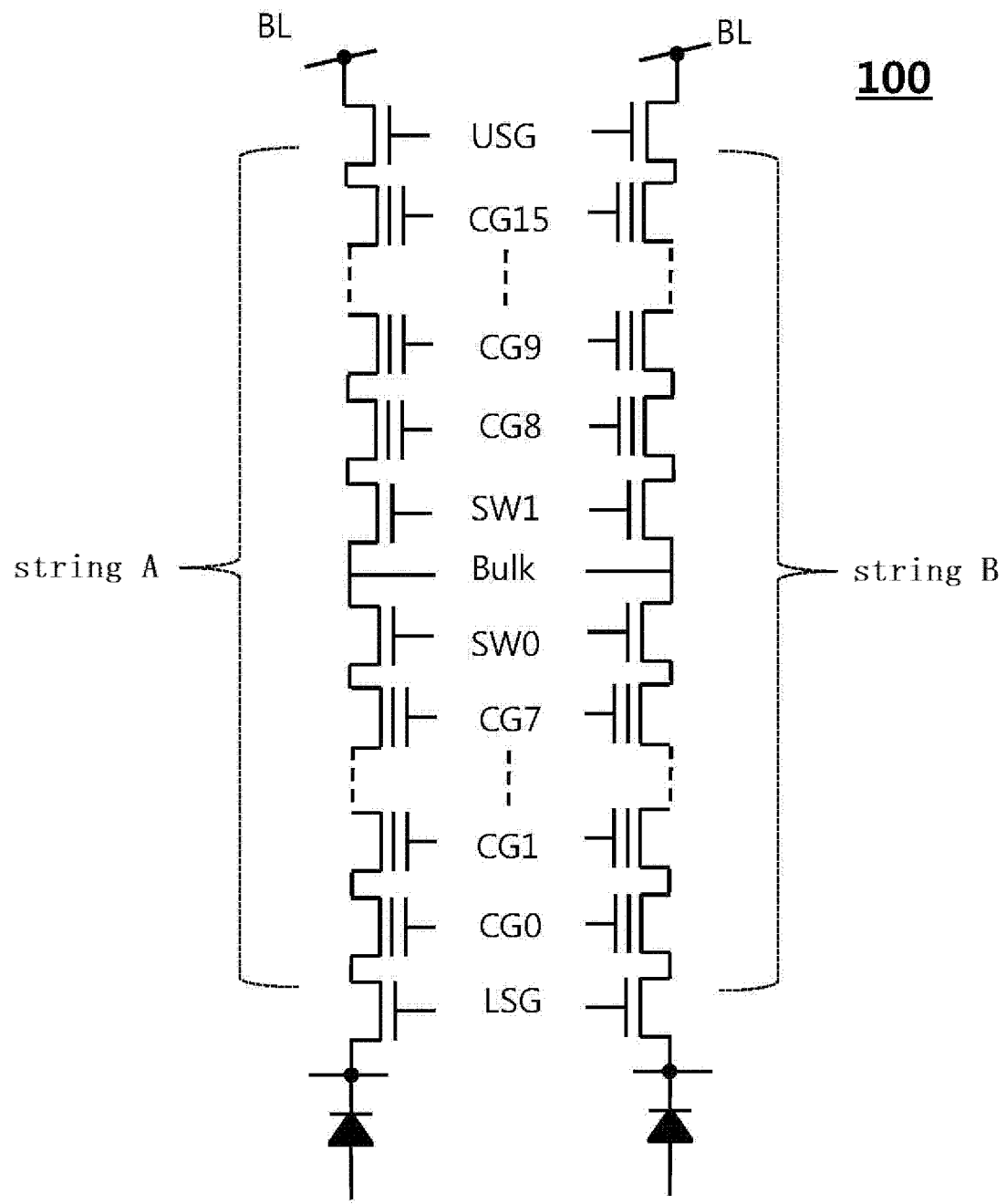
FIG. 1 shows a circuit diagram of NAND strings according to an embodiment.

Exemplary embodiments will be described below in more detail with reference to the accompanying drawings. The embodiments may, however, be modified in different forms and should not be construed as limiting. Throughout the disclosure, like reference numerals refer to like parts throughout the various figures and embodiments.

The drawings are not necessarily to scale and in some instances, proportions is exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

It should be understood that the definition of elements in the following description may include several meanings. For example, the term "gate" refers to one of various terminals of a transistor, such as a source, a drain or the like, but in some cases, also refers to a collection of logic gates, such as a NAND gate, a NOR gate and the like. In addition, a signal such as 'CG0', as used herein, refers not only to the gate of a transistor, but also a signal connected to the gate. This is because a signal is transmitted to the gate of a transistor, and thus there is no confusion between the gate and the signal.

The following description of exemplary embodiments and description of the accompanying drawings should be referred to understand advantages of the operation of the embodiments and objectives that are achieved by the embodiments.

The embodiments will now be schematically described with reference to equivalent circuit diagrams and cross-sectional views. FIG. 1 is a circuit diagram showing a NAND string according to an embodiment. A circuit diagram of an embodiment can be expressed as shown in FIG. 1. FIG. 1 includes various reference numerals in order to assist understanding of the embodiment. Although memory cells that directly store binary information may be configured to have 8 memory cells for each of upper and lower NAND strings, FIG. 1 omits some of the memory cells and shows only 3 memory cells for each NAND string. The NAND strings are divided into a left NAND string and a right NAND string. The left NAND string will be referred to as 'string A', and the left NAND string will be referred to as 'string B'. In addition, the NAND strings are divided into an 'upper NAND string' and a 'lower NAND string'. Thus, a left lower NAND string and a left lower NAND string, which include memory cells CG0 to CG15, can be referred to as an 'upper string A' and a 'lower string A', respectively. Particularly, when the upper and lower NAND strings need to be distinguished from each other, terms such as 'upper string' and 'lower string' will be used. When the left and right NAND strings need to be distinguished from each other, but the upper and lower NAND strings do not need to be distinguished from each other, terms such as 'string A' and 'string B' will be used. This distinction assists understanding of the embodiment. Each NAND string may include memory cells CG0 to CG15, select transistors UCG and LSG, and switching transistors SW0 and SW1. Particularly, a shielding nitride film may be included in place of switching transistors SW0 and SW1.

Although the number of memory cells in a NAND string depends on the intention of the developer, but in most cases, it is preferably $2^n$ (n=integer). For convenience, in FIG. 1, each unit NAND string includes eight (8) memory cells. In FIG. 1, some among the eight (8) memory cells are omitted. $2^n$ may be a number such as 4, 8, 16 or the like, because n is an integer as described above.

Figure 2:
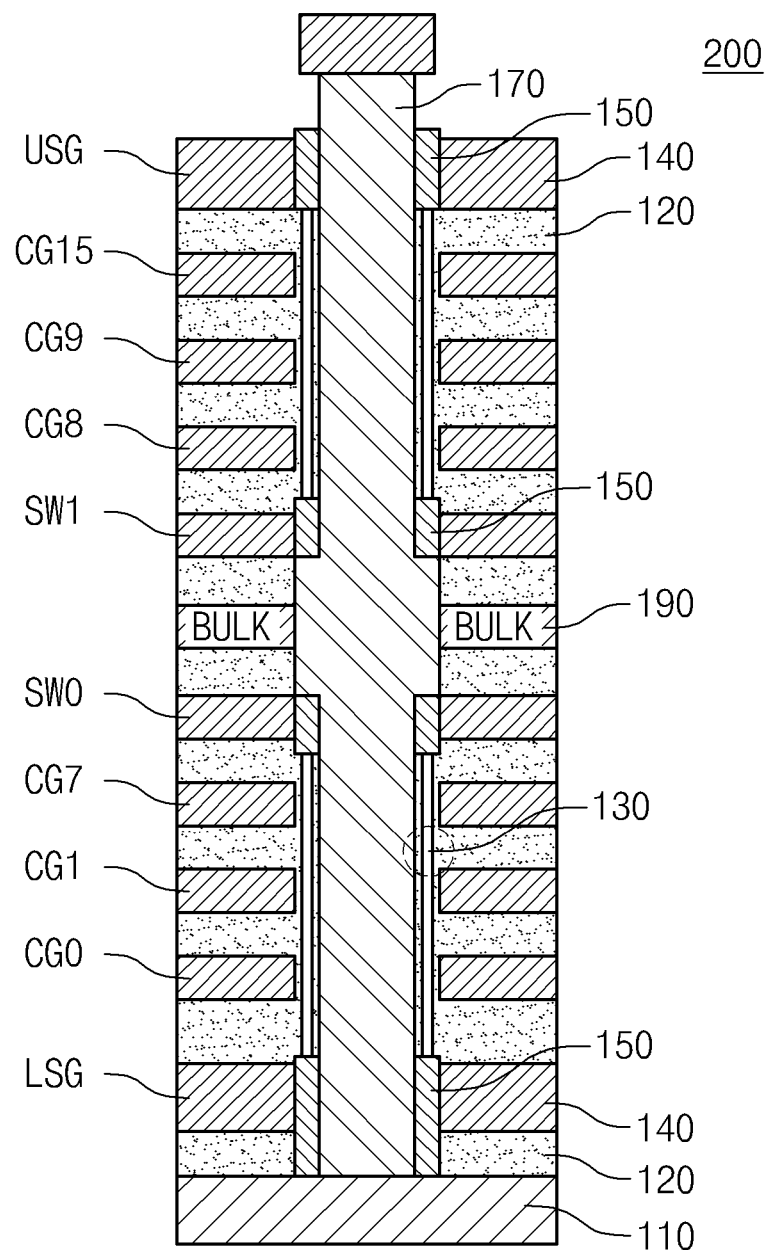
FIG. 2 shows a cross-sectional view of NAND strings according to an embodiment.

FIG. 2 is a cross-sectional view of a structure 200 corresponding to FIG. 1. As shown therein, an insulating layer 130 that can trap an electric charge is formed under control gates CG0 to CG15 of the memory cells.

The insulating layer 130 may be an oxide layer, a nitride layer, or a combination of a nitride layer and an oxide layer. This insulating layer 130 is located under the control gates of the memory cells, and thus acts as a gate insulating layer.

When the insulating layer 130 contains nitride, binary information can be programmed using charge trapping property of nitride. The gate insulating layer 130 may sometimes be a stack structure of an oxide layer, a nitride layer, and an oxide layer which are sequentially deposited. Such multilayered insulating layer is referred to as an ONO (Oxide-Nitride-Oxide) layer 130. If a gate layer is made of a conductive material such as polysilicon, a region ranging from the gate to the channel may include polysilicon, ONO, and the channel, which are sequentially deposited in that order when viewed from a cross-section. Thus, the region can be referred to as a SONOS (Silicon-Oxide-Nitride-Oxide-Substrate) structure. However, the gate (conductive) material is not limited to polysilicon. In some cases, it may include silicide or polycide.

As described below, a channel layer 170 in FIG. 2 may include polysilicon. By contrast, a typical semiconductor substrate may be grown into a single crystal and patterned. In embodiments, because the channel layer is filled after etching of the NAND string, an epitaxial growth method cannot be employed to form the channel layer. If necessary, the channel layer 170 may include polysilicon. As is well known in the art, polysilicon has low charge mobility and high resistivity compared to single crystal silicon. The channel layer may also include silicide or polycide which may be used to form the control gates CG0 to CG15.

Upper and lower select transistors LSG and USG, and switching transistors SW0 and SW1, perform different functions from the gate insulating layer 130 of memory cells that store binary information. Thus, a lower insulating layer 150 provided under gates of the select transistors LSG, USG may include different materials from the gate insulating layer 130. For example, the lower insulating layer 150 may include an insulating layer (e.g. oxide layer). As long as an applied voltage to the upper and lower select transistors LSG and USG and switching transistors SW0 and SW1 is controlled at such a level as not triggering charge trapping function, even a charge trap layer may be used as the lower insulating layer 150.

The conductive gate layers (or control gates) CG0~CG15 are isolated from each other by one or more interlayer insulating layers 120. Only one interlayer insulating layer is indicated by the reference numeral. The interlayer insulating layers 120 may be made of an insulating layer that does not trap electric charges, for example an oxide layer. The channel layer 170 is filled with polysilicon and has a pillar shape.

The upper and lower select transistors USG and LSG provide an electrical connection with the adjacent NAND string. For example, when a single NAND string is to be selected among a plurality of NAND strings and connected to a given bit line, the upper and lower select transistors USG and LSG perform this function. Of course, for this function, a combined address is provided to the gates of the upper and lower switching transistors SW1 and SW0. The switching transistors SW0 and SW1 further operate to prevent the threshold voltages of the cell transistors CG7 and CG8 from changing due to the capacitive coupling between the bulk layer 190 and the cell gates of the transistors CG7 and CG8 in memory cells (e.g., elements such as CG7 and CG8 in FIG. 1) adjacent to the bulk layer 190. This will be described in detail later.

Figure 3:
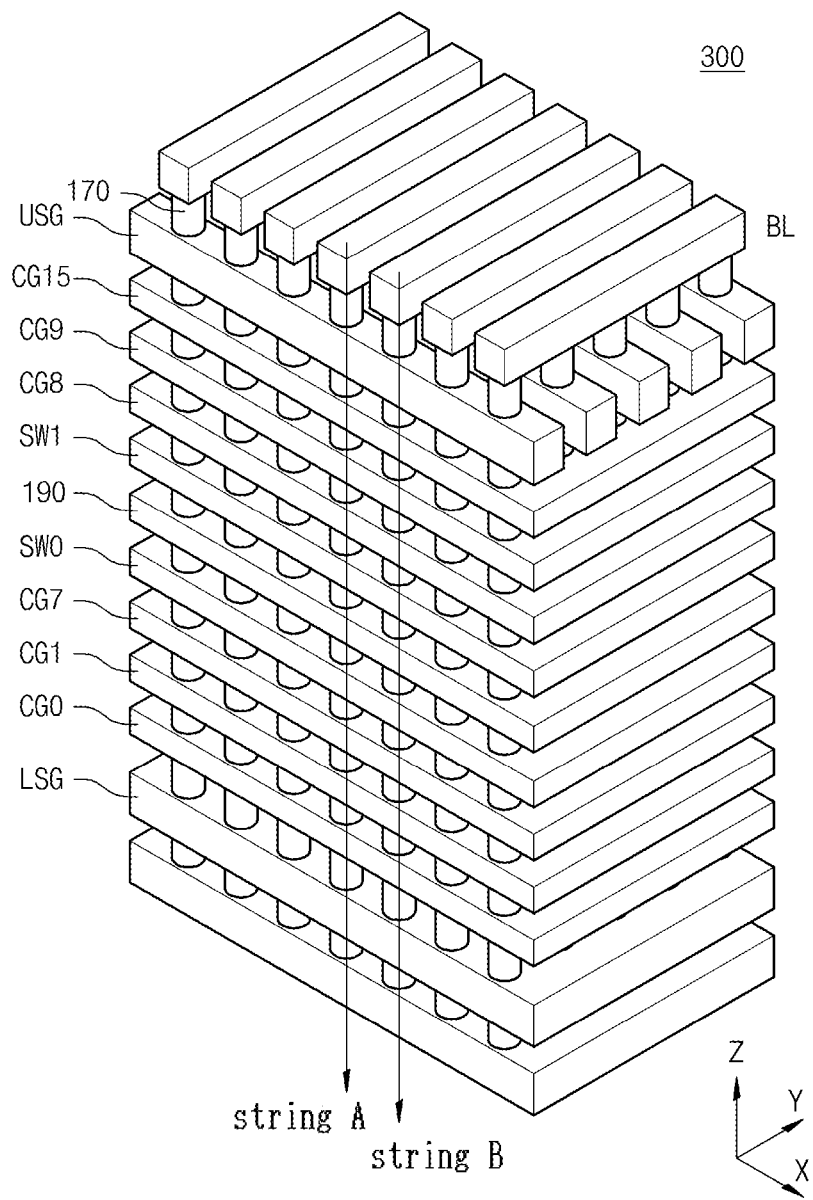
FIG. 3 shows a three-dimensional view of NAND strings according to an embodiment.
Figure 10:
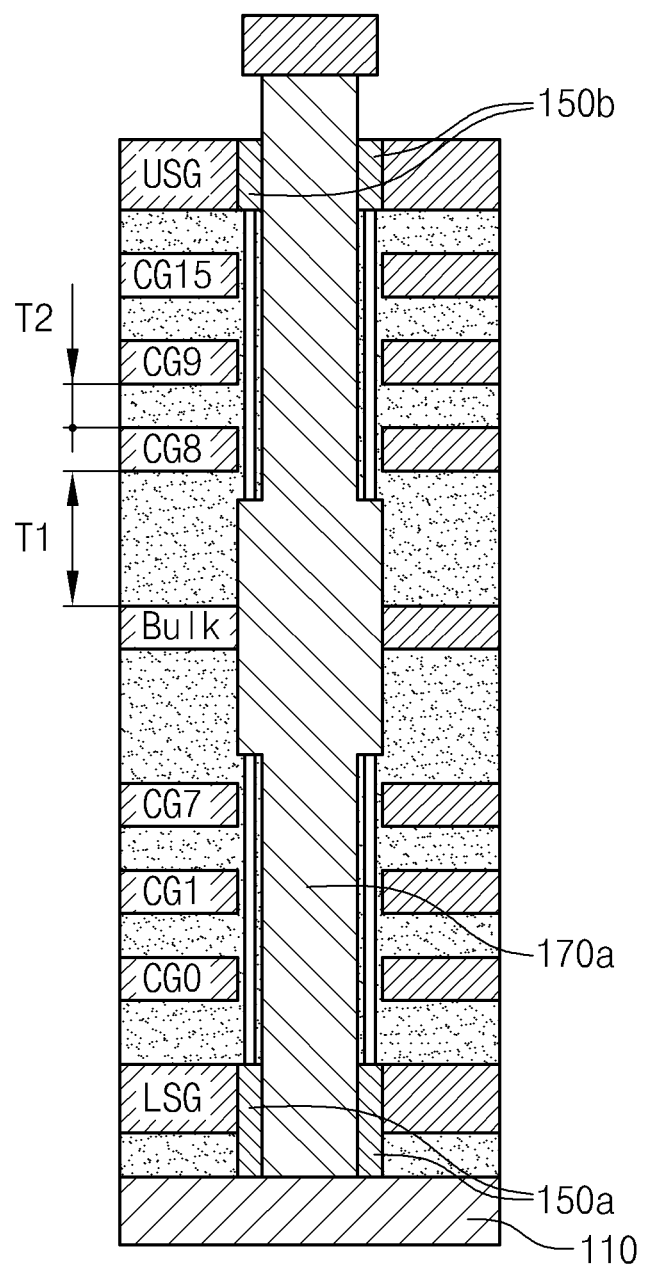
FIG. 10 shows Embodiment 2.

FIG. 3 shows the three-dimensional configuration 300 of the structure shown in FIGS. 1 and 2. In FIG. 3, the X-, Y- and Z-directions are shown to indicate directions of the three-dimensional configuration. As shown therein, the channel layer 170 is formed through an alternating stack of the conductive gate layer and the insulating layer in the Z-direction and has a pillar shape. Each NAND string is connected to a bit line (BL) extending in the Y-direction, and the upper select transistor USG connects the NAND strings to each other in the X-direction. The channel layer is filled with a conductive material, such as polysilicon, silicide, and/or polycide, depending on the shape of a hole formed therein. As shown in FIG. 10, the vertical channel may be formed in various shapes, for example, a cylindrical shape, a square pillar shape, or a triangular pillar shape, depending on the shape of the hole.

Programming Operation

Figure 4:
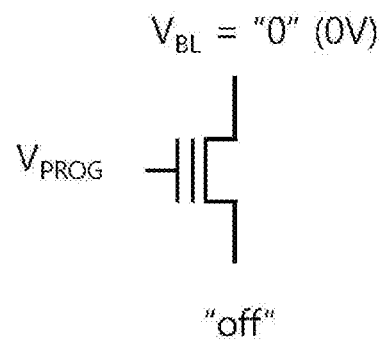
FIG. 4 shows an equivalent circuit when a memory cell is programmed as "0".
Figure 5:
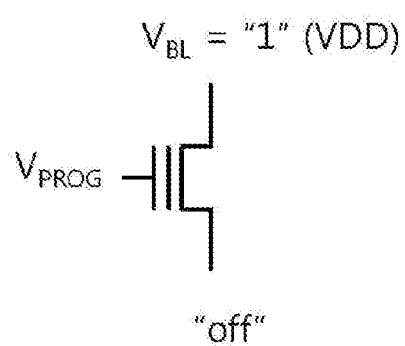
FIG. 5 shows an equivalent circuit when a memory cell is programmed as "1".

When binary information of "0" or "1" is programmed in the memory cell, voltage conditions as shown in FIGS. 4 and 5 are applied. A voltage corresponding to "0" or "1" is applied to the bit line. These voltages may be ground voltage (0V) or power supply voltage (VDD). If "0" is programmed in the memory cell CG0, the bit line voltage $V_{BL}$ is maintained at 0V, and the power supply voltage (VDD) is maintained so that the select transistor are in an "ON" state. Among the memory cells, unselected cells CG1 to CG15 may be simply maintained in an "ON" state, because they should not interfere with the programming operation. A voltage for maintaining the "ON" state, that is, a $V_{PASS}$ voltage, is applied to the gates of these unselected memory cells and may be, for example, about 10V. To the gate of the cell CG0 to be programmed, a programming voltage $V_{PROG}$ is applied. The $V_{PROG}$ voltage may be suitably selected depending on the characteristics of the device and may be, for example, about 18V. Electrons flowing in the channel layer are trapped in the gate insulating layer by an electric field generated by the difference in voltage between the gate and the bit line. Due to the trapped electrons, the threshold voltage of the memory cell is further increased. For convenience, the increased threshold voltage is expressed as $V_{TH\_}0$.

If a bit line voltage $V_{BL}$ corresponding to "1" is applied in order to program "1", the difference in voltage between the gate electrode $V_{PROG}$ of the cell to be programmed and the voltage $V_{BL}$ is decreased. Electrons flowing in the channel layer are not trapped in the gate insulating layer, and the threshold voltage of the memory cell is maintained intact. When this threshold voltage is expressed as $V_{TH\_}1$ for convenience, the relationship $V_{TH\_}0 > V_{TH\_}1$ is established. Voltage conditions that are applied to the NAND strings during the programming operation are summarized below, and the equivalent circuits of the memory cells to be programmed are shown in FIGS. 4 and 5. It is to be understood that a non-selected memory cell is simply omitted in the equivalent circuits, because it should not influence an access operation, even though it performs a simple pass function. From the equivalent circuits, voltage conditions that are applied to the selected memory cell during the programming operation can be understood in further detail.

Voltage conditions during the programming operation may be as follows:

Bit line voltage $V_{BL}$: "0" (0V) or "1" (VDD)
Gate voltage $V_{USG}$ of the upper select transistor USG: VDD
Gate voltage of unselected cells CG1 to CG15: $V_{PASS}$ (10V)
Gate voltage of the upper switching transistor ($V_{SW1}$): $V_{SW1}$ (1-5V)
Gate voltage of the lower switching transistor $V_{SW0}$: $V_{SW0}$ (1-5V)
Gate voltage of the selected cell (CG0): $V_{PROG}$ (18V)
Gate voltage of the lower select transistor: $V_{LSG}$ (1-5V)
Voltage of bulk layer: $V_{BULK}$ (0-1 V)

Reading Operation

Figure 6:
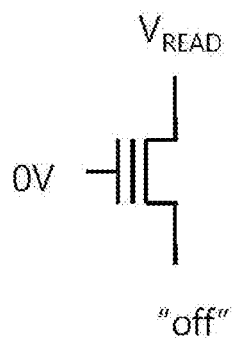
FIG. 6 shows an equivalent circuit of NAND strings in a reading operation.

To read the binary information stored in the memory cell CG0, the bit line voltage $V_{BL}$ applies a reading voltage $V_{READ}$. The voltage $V_{READ}$ is applied at such a level that electric currents flow from the bit line through the channel of the memory cell, and this voltage is generally lower than the power supply voltage. Because only the memory cell CG0 to be read should be selected, the voltage $V_{PASS}$ is applied to the unselected memory cells other than CG0 and the select transistors can be switched "ON". The voltage $V_{PASS}$ may be lower than the voltage $V_{PASS}$ applied during the programming operation. The source of the memory cell that is selected by the select transistor closer to the substrate 110 is connected to the ground voltage. If the selected memory cell stores data "0", the reading voltage that is applied to the gate will be lower than the threshold voltage $V_{TH\_0}$, and thus an electric current will not flow in the memory cell. If the selected memory cell stores data "1", the reading voltage that is applied to the gate will be higher than the threshold voltage $V_{TH\_1}$, and thus an electric current will flow in the memory cell. Voltages that are applied to the NAND string during the reading operation are summarized below. The circuit of the memory cell during the reading operation is shown in FIG. 6. From the equivalent circuit, voltage conditions that are applied to the selected memory cell during the programming operation can be understood in further detail.

Voltage conditions during the reading operation may be as follows:

Bit line voltage $V_{BA}$: $V_{READ}$
Gate voltage $V_{USG}$ of upper select transistor USG: VDD
Gate voltage of non-accessed memory cells CG1 to CG15: $V_{PASS}$ (3-5V)
Gate voltage of upper switching transistor $V_{SW1}$: $V_{SW1}$ (1-5V)
Gate voltage of lower switching transistor $V_{SW0}$: $V_{SW0}$ (1-5V)
Gate voltage of accessed memory cell CG0: 0V
Gate voltage of lower select transistor: $V_{LSG}$ (1-5V)
Voltage of bulk layer: $V_{BULK}$ (0-1V)

Erasing Operation

Figure 7:
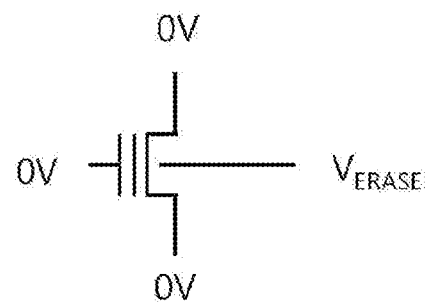
FIG. 7 shows an equivalent circuit of NAND strings in an erase operation.

To erase the binary information stored in the memory cell, a high erase voltage $V_{ERASE}$ is applied between the bulk layer and the gate of the selected cell. Due to an electric field generated by the high voltage, the electrons trapped in the gate insulating layer move to the bulk layer. Herein, a high erase voltage $V_{ERASE}$ of about 20V is applied to the bulk layer, and ground voltage is applied to the selected gate. This erase mechanism is known as the Fowler-Nordheim tunneling effect. Voltages that are applied to the nodes are summarized below. The equivalent circuit of the memory cell during the erasing operation is shown in FIG. 7. From the equivalent circuit, voltage conditions that are applied to the relevant memory cell during the programming operation can be understood in further detail.

Voltage conditions during the erasing operation may be as follows:

Bit line voltage $V_{BA}$: Floating
Gate voltage $V_{USG}$ of upper select transistor USG: Floating
Gate voltage of non-accessed cells CG1 to CG15: 0 V
Gate voltage of upper switching transistor $V_{SW1}$: Floating
Gate voltage of lower switching transistor $V_{SW0}$: Floating
Gate voltage of accessed cell CG0: 0 V
Gate electrode of lower select transistor: Floating
Voltage of bulk layer: $V_{erase}$ (10-25 V)

In the erasing operation, the erase voltage $V_{erase}$ is applied to the bulk layer. Because the bulk layer is present between the upper and lower NAND strings, the resistance of a region ranging from the bulk layer to the channel of each memory cell is minimized.

The operations of the memory cells, which have been described above in detail, are summarized in Table 1 below. Voltage values shown in Table 1 are illustrative only.

TABLE 1

| | Programmed as "0" | Programmed as "1" | Reading | Erasing |
|---|---|---|---|---|
| Bit line voltage $V_{BL}$ | 0 V | VDD | $V_{READ}$ | Floating |
| Gate voltage $V_{USG}$ of Upper select transistor | VDD | VDD | VDD | Floating |
| Gate voltages ($V_{CG1}$ to $V_{GCG15}$) of non-selected memory cells | $V_{PASS}$ (=10 V) | $V_{PASS}$ (=10 V) | $V_{PASS}$ (=4 V) | OPEN |
| Gate voltage ($V_{CG0}$) of selected memory cell | $V_{PROG}$ (=18 V) | $V_{PROG}$ (=18 V) | 0 V | 0 V |
| Upper switching transistor voltage ($V_{SW1}$) | $V_{SW1}$ (=1-5 V) | $V_{PASS}$ (=10 V) | $V_{PASS}$ (=1-5 V) | Floating |
| Lower switching transistor voltage ($V_{SW0}$) | ($V_{SW0}$) (=1-5 V) | $V_{PASS}$ (=10 V) | $V_{PASS}$ (=1-5 V) | Floating |
| Lower select gate voltage $V_{LSG}$ | 0 V | 0 V | VDD | Floating |
| Bulk voltage $V_{BULK}$ | 0 V | 0 V | 0 V | $V_{ERASE}$ (=18 V) |

Embodiment 1

As used herein, the term "NAND string" refers to a structure in which a plurality of memory cells is connected to each other in series as shown in FIGS. 1 and 2. In a single NAND string, $2^n$ (e.g., 8, 16, 32, etc.) memory cells are provided. In addition, logic transistors that do not include memory cells are connected to both selection portions of the NAND string. The Upper Select Gate (USG) is connected to a bit line so that binary information is written or read. In order for binary information to be stored in the NAND string, the Lower Select Gate (LSG) should be connected to a specific voltage, for example, ground voltage. If an electric current does not flow through the upper and lower select transistors USG and LSG, binary information cannot be read or written in the memory cell.

The memory cells stacked vertically with respect to an upper surface of the semiconductor substrate 110 may have a structure different from the upper and lower select transistors USG and LSG. The nonvolatile memory cells generally memorize binary information by storing electric charges in the trap of the floating gate or the nitride layer or removing the electric charges. This floating gate or nitride layer that stores electric charges can interact with the operation of the upper and lower select transistors USG and LSG. For this reason, the upper and lower select transistors USG and LSG may be fabricated so that the gate insulating layer 150 does not contain a charge-storing material. However, as described above, a nitrogen-containing insulating layer may also be used where a voltage is not applied that is large enough to cause charge trapping.

Hereinafter, a process for fabricating the NAND string structure will be described in further detail with reference to FIGS. 8a to 8i.

Formation of Lower Select Transistor

Figure 8A:
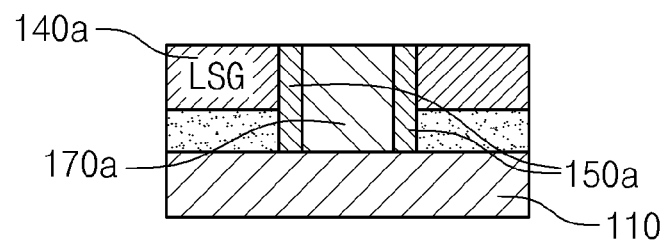
FIGS. 8a to 8l sequentially show the steps of a fabrication process according to Embodiment 1.

The Lower Select Gate (LSG) of the NAND string can be formed using various methods. For example, an active region may also be formed on a semiconductor substrate or a structure connected to the semiconductor substrate, for example, using a diffusion technique. This method is typically similar to the TCAT technology or the P-BiCS technology for a folded structure. Like the BiCS technology, the structure exemplified in FIG. 8a is formed by forming a conductive gate layer to be used as the lower select gate LSG by a deposition process or the like, exposing the sidewall of the formed layer by etching, forming a gate insulating layer 150a on the sidewall, and then filling a conductive semiconductor material (such as polysilicon) for forming a channel layer 170a. The gate insulating layer does not function to store electric charges. However, the method for forming the lower select gate LSG is not limited thereto and can be performed by various other methods.

Stacking of Lower NAND String

Figure 8B:
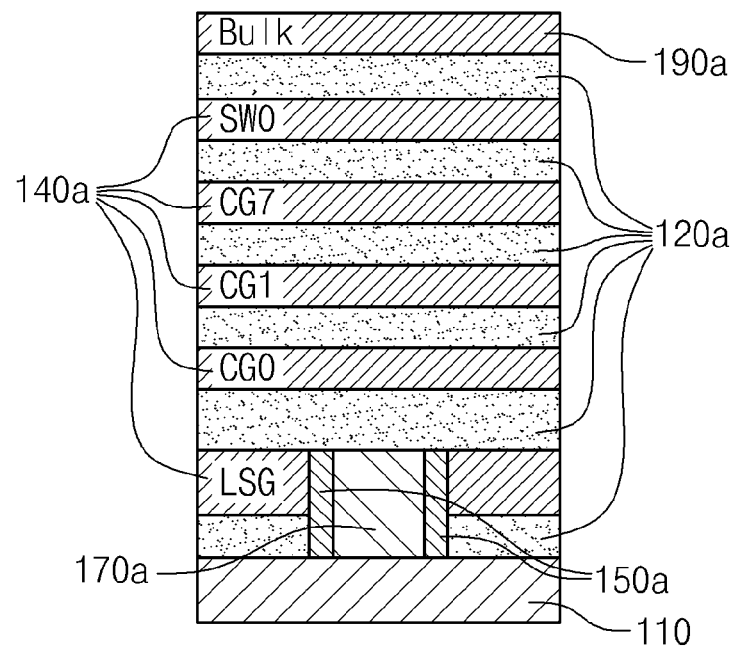

To make the lower select transistor LSG and memory cells of the NAND string, as shown in FIG. 8b, an interlayer insulating layer 120a and a conductive gate layer 140a are repeatedly and alternately formed on a semiconductor substrate 110. The number of the repeatedly stacked layers is determined depending on the number of memory cells in the NAND string. In this embodiment, the number of memory cells in the lower NAND string is eight (8). In the figure, for convenience, intermediate memory cells are omitted, and only memory cells CG0, CG1 and CG7 are shown. The repeatedly stacked layers include a lower select transistor SW0 and a conductive gate layer 190a serving as an erasing bulk layer. The erasing bulk layer 190a can be positively ($P^+$) doped.

It is to be understood that the interlayer insulating layer and the conductive gate layer can be repeatedly stacked using various methods. For example, in a first method, oxide for the interlayer insulating layer and polysilicon for the conductive gate layer (or control gate) are alternatively stacked. Alternatively, in a second method, sacrificial undoped polysilicon and doped polysilicon for the conductive gate layer (and/or control gate) may be alternately stacked; a slit is made over the stacked structure, and etching is performed through the slit using etch selectivity to selectively remove the undoped polysilicon; oxide is filled into spaces created by removal of the sacrificial undoped polysilicon. The second method takes advantages of different etch selectivity between the doped polysilicon and the sacrificial undoped polysilicon. Although the intermediate process of the second method differs from that of the first method, substantially the same structure as that of the first method (in which oxide and doped polysilicon are alternately stacked) is finally obtained using the second method.

In a third method for repeatedly stacking the layers, oxide for the interlayer insulating layer and sacrificial nitride are alternately stacked. The sacrificial nitride is selectively removed using a method such as slit etching after the completion of stacking and the formation of a channel region. As used herein, the term "slit etching" refers to a method in which etching is performed through a slit made in a direction perpendicular to an upper surface of the stack separately from the channel region. The slit etching is a well-known etching method, and thus the detailed description thereof is omitted herein. The etching process employing the slit may be performed before or after formation of the channel region. A doped polysilicon layer or a metal layer may be filled into spaces which are created by removal of the sacrificial nitride by the slit etching process, thereby forming a conductive gate layer. The final stack structure obtained in the third method is similar to that obtained in the first method.

Figure 8C:
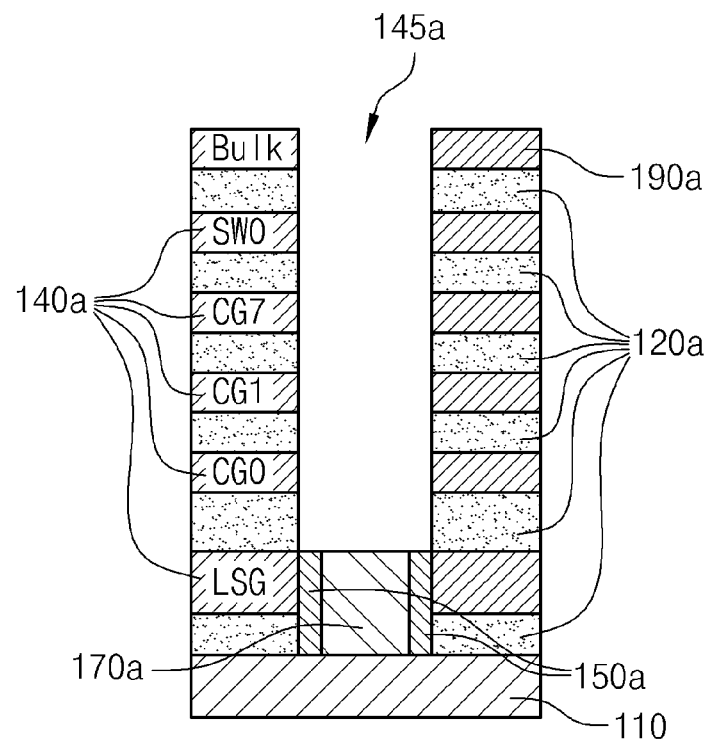
Figure 8D:
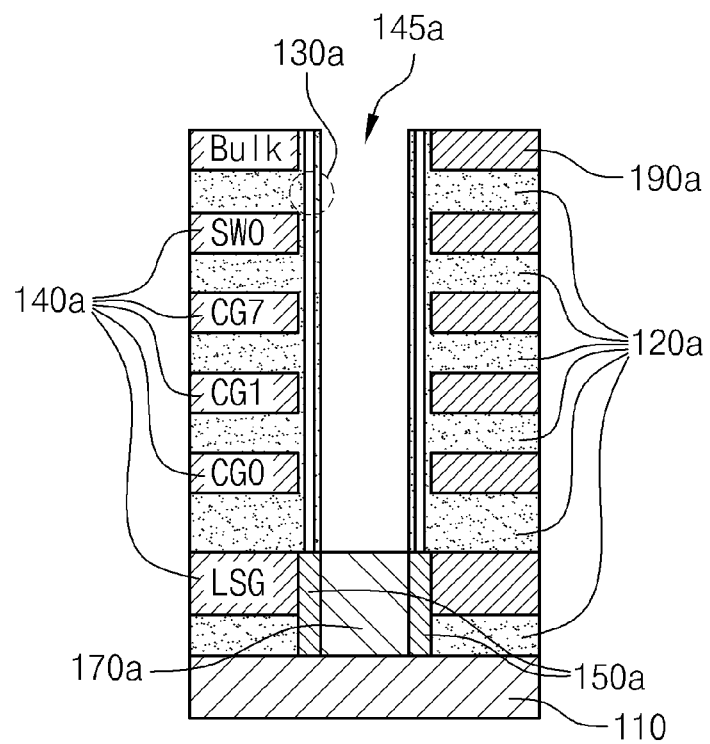

The slit etching process can be applied to the above-described second and third methods in substantially the same manner, and this process may be performed after forming the channel region and the composite insulating layer 130a as shown in FIG. 8d. Various modifications of this fabrication process can be made. Certain technology related to slit etching is disclosed, among others, in Korean Patent Registration No. 10-1083637, which is incorporated by reference in its entirety herein for all purposes.

In the fabrication methods as described above, conductive gate layers 140a are coupled to a word line that accesses the memory cells, and thus resistance may desirably be minimized in view of electrical properties. Thus, it is to be understood that the term "conductive gate layers 140a" is used herein in order to emphasize this property.

In addition, the above-described fabrication methods may be applied not only to Embodiment 1, but also to other embodiments which will be described later.

Etching of Channel Region

Next, as shown in FIG. 8c, a region in which a vertical channel is to be formed is opened by etching to form a first space 145a. It is to be understood that the channel layer is formed in a pillar shape by etching, and formed by filling the first space in a hole shape. FIG. 8c is a cross-sectional view of the structure resulting from the etching process, and thus the NAND string is shown as being divided into two portions. Although the formation of the channel layer is may be performed using a dry etching method, any method may be used to form the channel layer, as long as it can define and form the channel layer.

Formation of Composite Insulating Layer

Next, as shown in FIG. 8d, a composite insulating layer (or multi-layered insulating layer) 130a is formed over a sidewall of the first space 145a. The composite insulating film preferably includes a nitrogen compound or nitride. This is because charges can be trapped in the nitride layer so that binary information can be stored. Examples of the composite insulating layer include various combinations of materials, such as Oxide-Nitride, Oxy-Nitride, Oxide-Nitride-Oxide (ONO) and the like.

Formation of Channel Polysilicon Layer

Figure 8E:
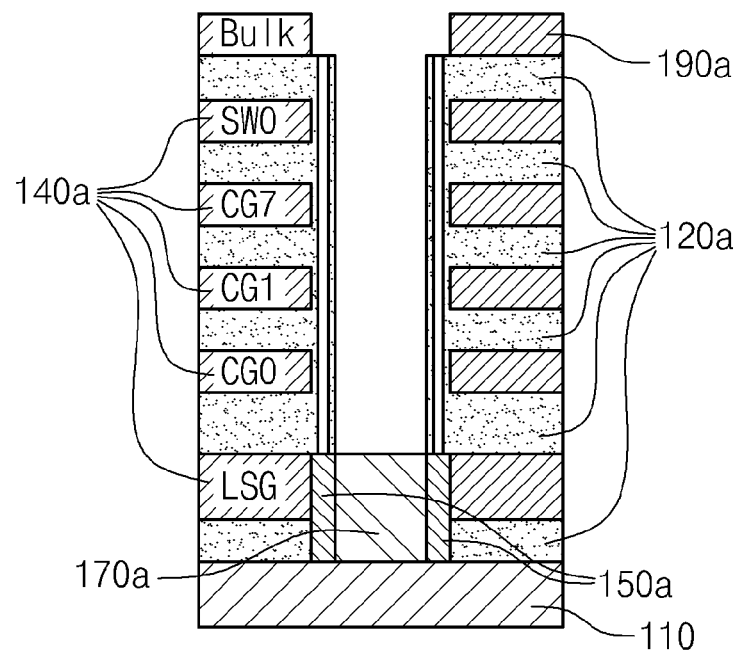
Figure 8F:
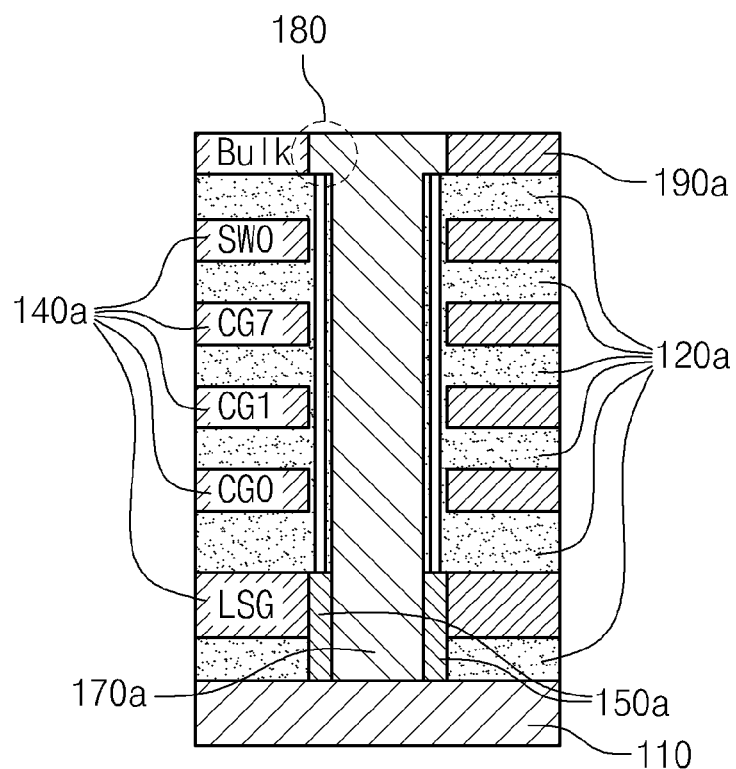

The composite insulating film formed over a sidewall of the bulk layer 190 is removed (FIG. 8e). This process may be performed by using a recess etching method, or by etching the composite insulating film formed over the bulk layer slightly more than other layers, or by using a photomask. Then, polysilicon for forming the channel region is filled in the first space 145a (FIG. 8f). In this process, the channel polysilicon comes into direct contact with the bulk layer 190a. Herein, the channel region has a protrusion 180 near the bulk layer. Next, the filled channel layer and the bulk layer are planarized using a suitable process. For planarization, Chemical Mechanical Polishing (CMP) or etch back may be employed. The channel layer may be P-doped.

The newly filled polysilicon also comes into contact with the previously filled polysilicon layer 170a, and thus the channel polysilicons are combined with each other. Then, the uppermost surface of the resulting structure is planarized.

According to this process order, the ONO film remains over a sidewall of the lower switching transistor SW0, but does not influence electrical operation of the device. DC voltage applied to the lower switching transistor SW0 as high as capable of screening an electric field to the adjacent memory cell during the erasing operation of the bulk layer, but not so high as that applied during erasing or programming operation. Thus, DC voltage applied to the lower switching transistor SW0 does not disturb the lower switching transistor's switching operation. Thus, the presence of the ONO film in the lower switching transistor SW0 does not disturb the operation of the device. In this way, the lower NAND string is fabricated.

Formation of Upper NAND String

Figure 8G:
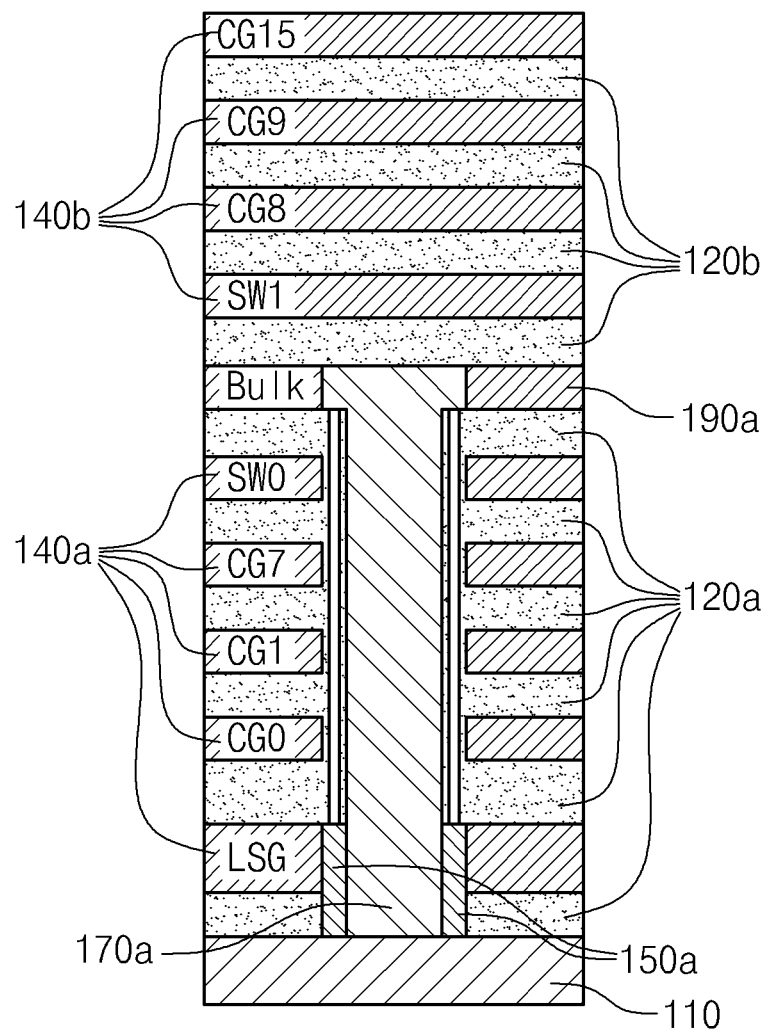

As shown in FIG. 8g, interlayer insulating layers 120b and conductive gate layers 140b are repeatedly and alternatively stacked on the planarized region. In this process, a conductive gate serving as the upper select gate USG is not yet formed (unlike the case of FIG. 8b). It may be beneficial to stack the conductive gate layers in later processes in order to form a gate insulating film on the upper select transistor, like the sidewall of the lower select transistor LSG.

Figure 8H:
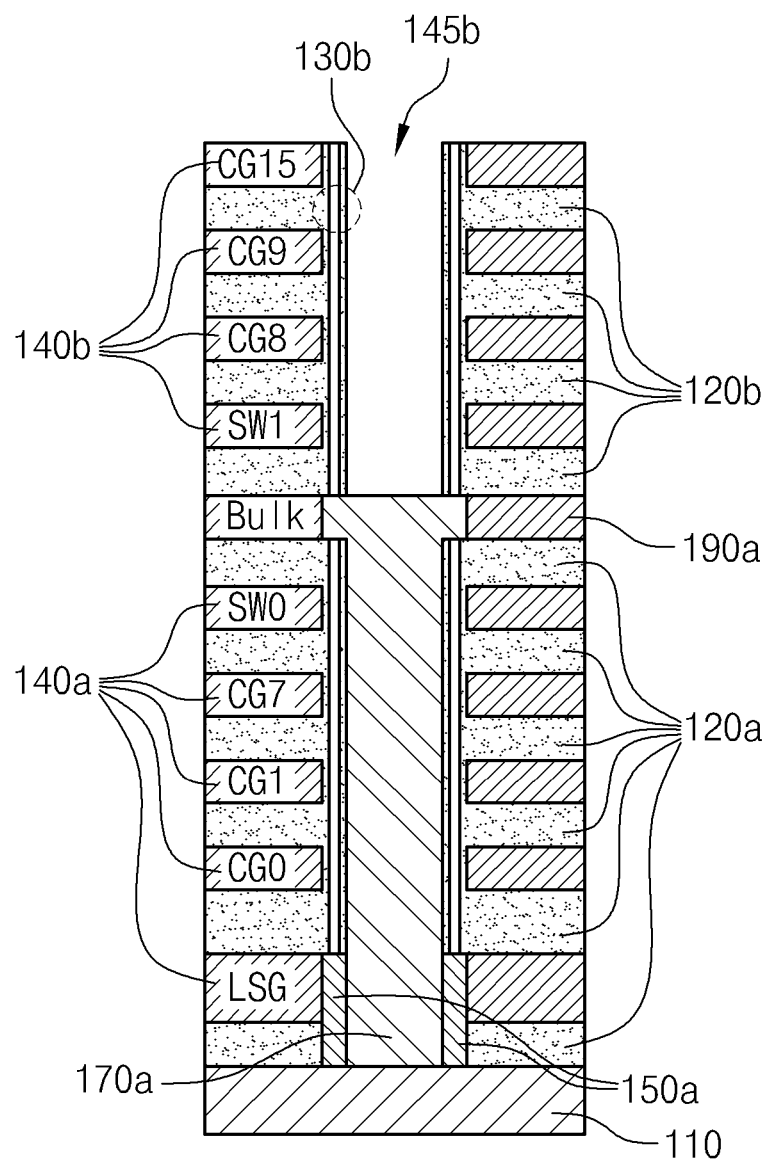

The upper stack is etched to form a second space 145b which will be filled to form a channel region. Then, as shown in FIG. 8h, a composite insulating layer 130b is formed. The upper composite insulating layer 130b preferably includes a nitrogen compound or nitride, like the lower composite insulating layer 130a, and examples thereof include various combinations of materials, including Oxide-Nitride, Oxy-Nitride, Oxide-Nitride-Oxide (ONO) and the like.

Figure 8I:
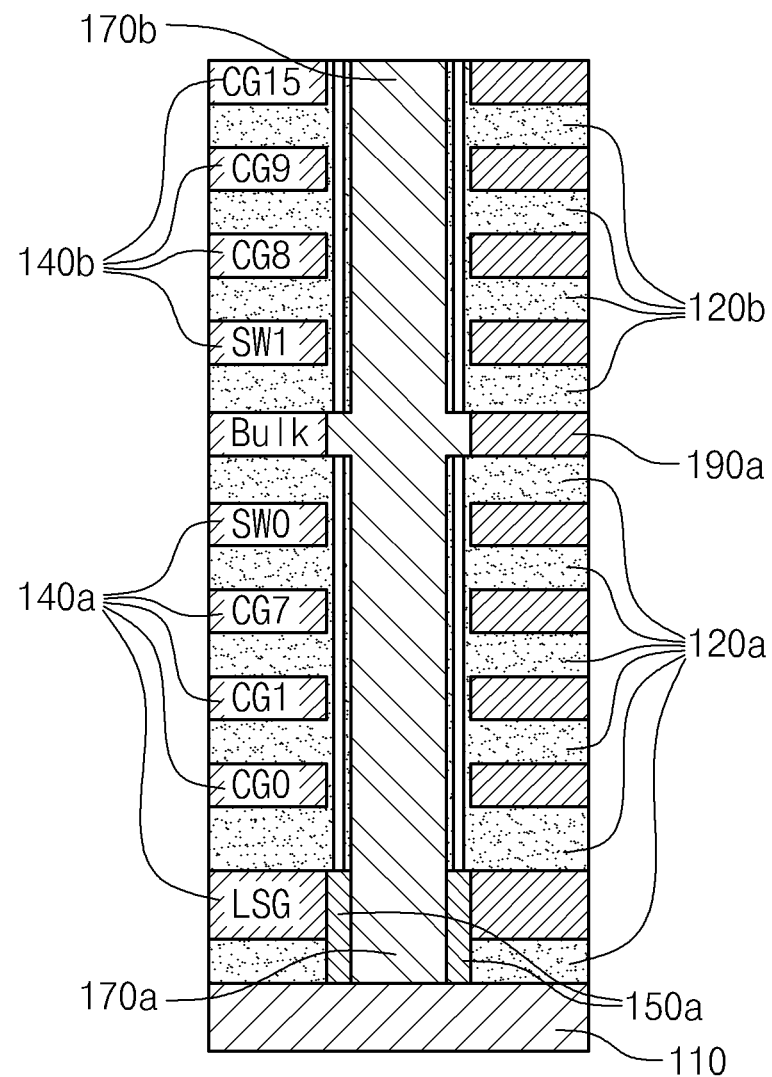
Figure 8J:
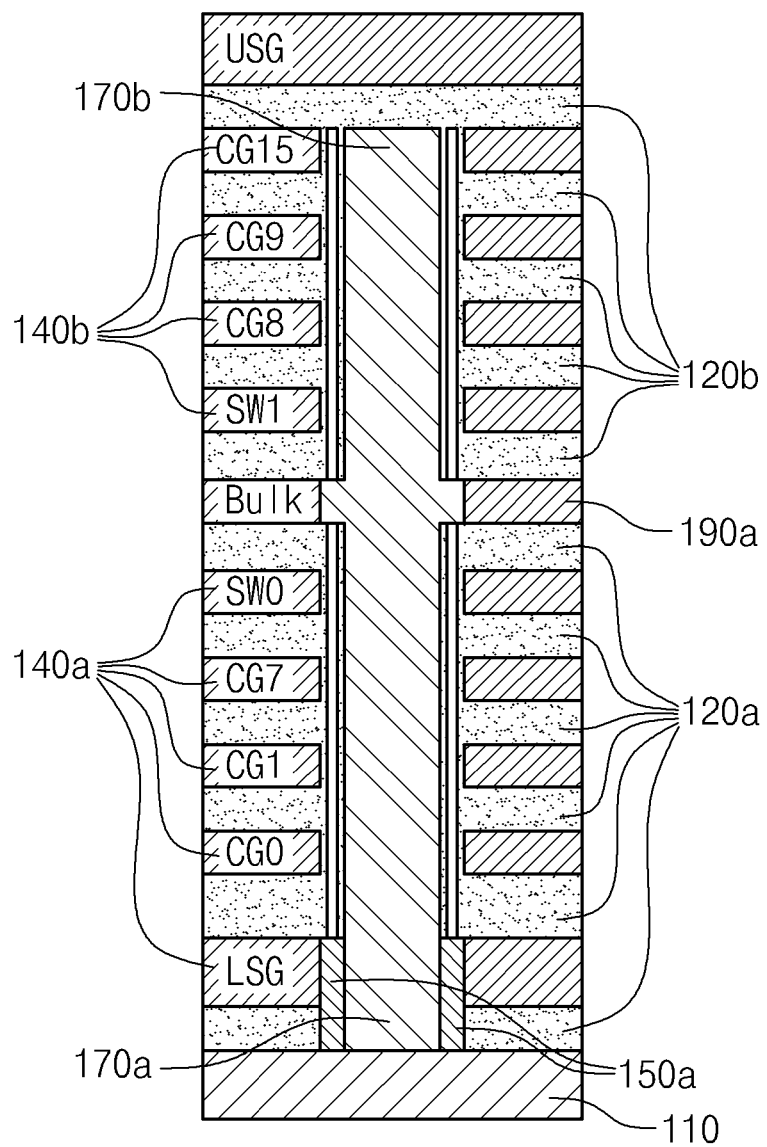
Figure 8K:
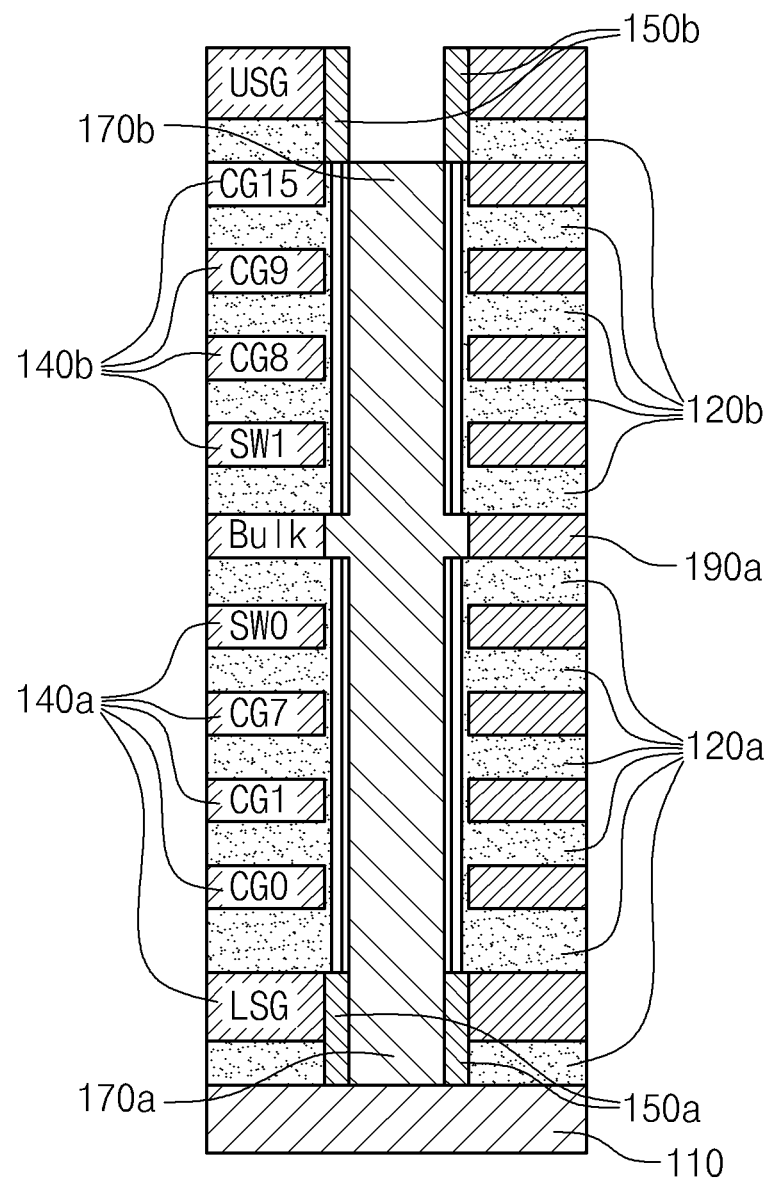

The second space 145b is filled with a polysilicon 170b for forming the upper channel region (FIG. 8i). The filled polysilicon is planarized, and an interlayer insulating layer and a conductive gate layer serving as an upper select transistor USG are formed (FIG. 8j). Then, the interlayer insulating layer and the conductive gate layer are etched so as to expose sidewalls of the interlayer insulating layer and the conductive gate layer (or upper select transistor USG). See FIG. 8k. When the second space 145b is formed and when other channel regions are defined, the same photo-mask as used when (the first space 145a) can be used, and thus the effect as if the upper and lower channel polysilicons are self-aligned to each other can be obtained, and this feature is one of the important characteristics of the embodiments.

Figure 8L:
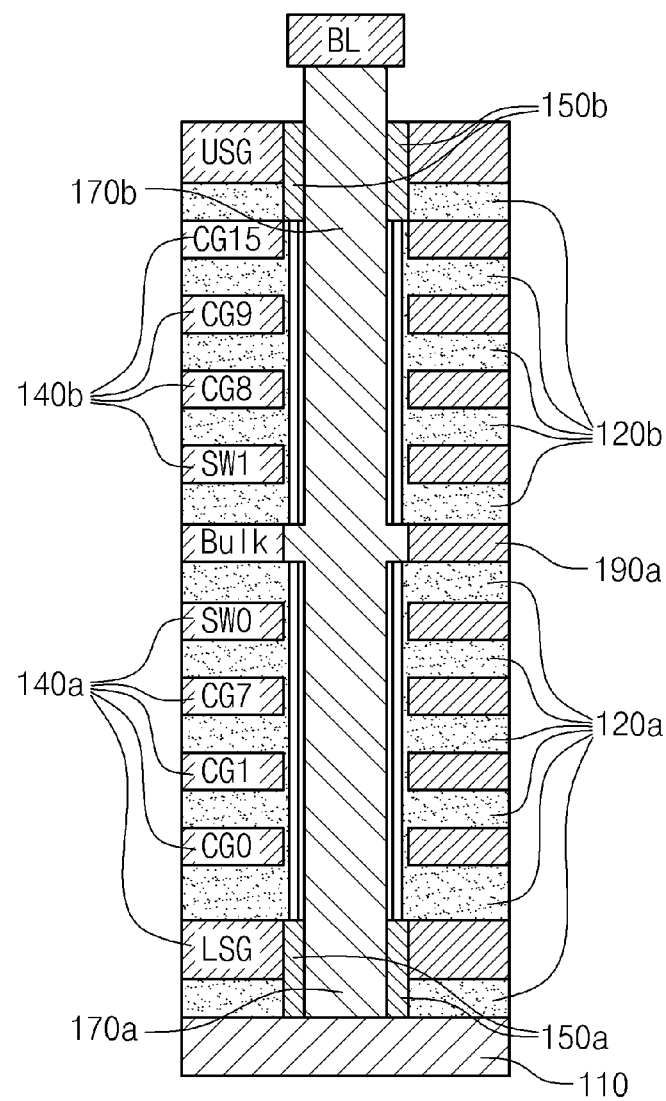

A gate insulating layer 150b is formed over a sidewall of the upper select transistor USG, and then polysilicon is filled in the second space (FIG. 8l). The upper channel polysilicon 170b is ultimately connected to a bit line BL. The conductive gate layers 140b in the upper NAND string I may also be P+ doped, like the conductive gate layers 140a in the lower NAND string.

Figure 14:
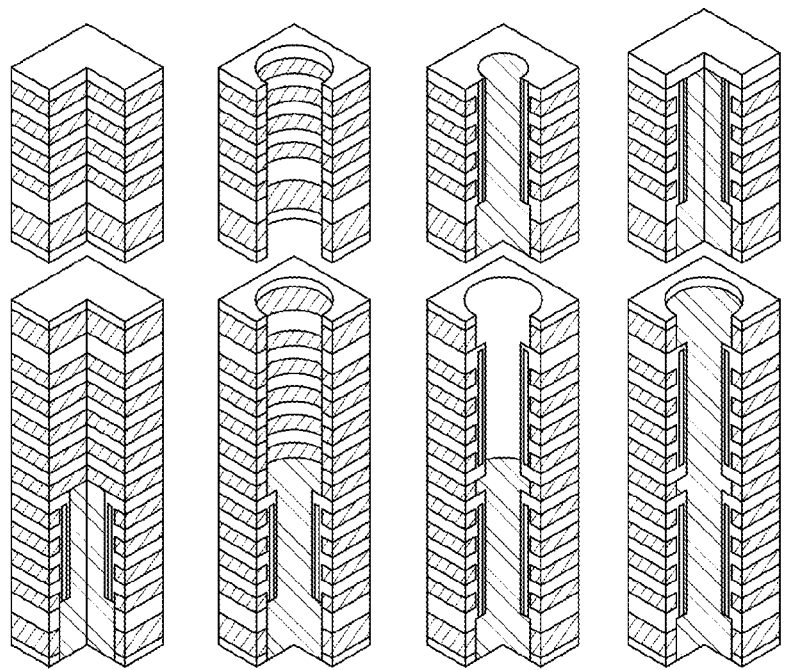
FIG. 14 shows various vertical channel shapes.

The channel layer is formed in a pillar shape, and a space which is filled by the channel layer has a hole shape when viewed from a top of the device as shown in FIG. 14. However, it is to be understood that, because FIGS. 8a to 8l are cross-sectional views of the structure, the NAND string is shown as if it is divided into two portions. Although the formation of the channel layer is preferably performed using a dry etching method, any method may be used to form the channel layer.

Switching Transistors Made of Oxide

When the upper and lower switching transistors SW1 and SW0 are to be formed using oxide rather than ONO, the fabrication process becomes slightly more complex.

Figure 9A:
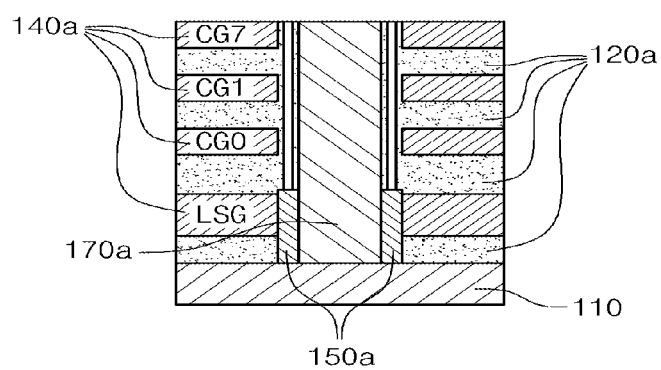
FIGS. 9a to 9d sequentially show the steps of another fabrication process according to Embodiment 1.

The lower stack is formed by processes shown in FIGS. 8a to 8d, except for the formation of conductive gates corresponding to the lower switching transistor SW0 and the bulk layer, resulting in a structure as shown in FIG. 9a.

Figure 9B:
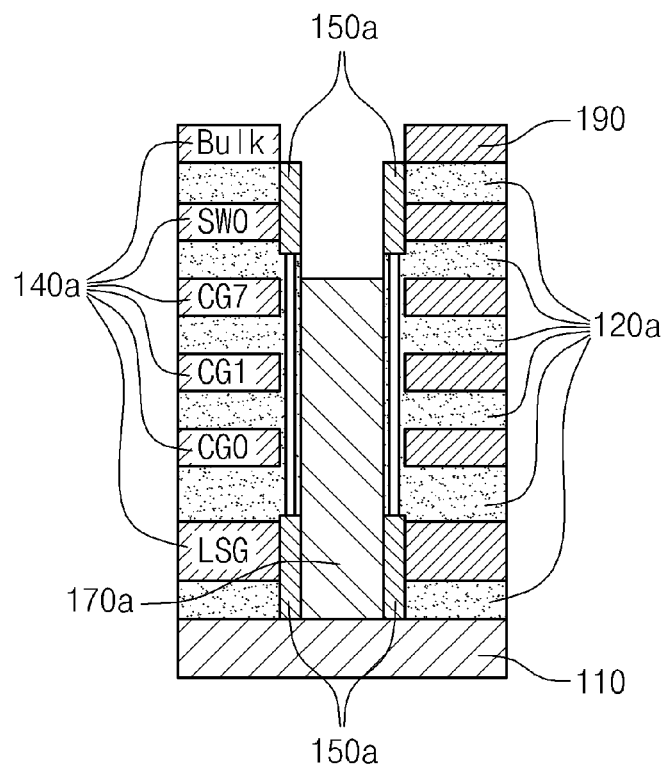

Then, the conductive gates serving for the lower switching transistor SW0 and the bulk layer are stacked. A space defining the channel region is formed by etching the lower switching transistor SW0 and the bulk layer. The gate oxide film 150a is formed over a sidewall of the space formed by the etching process, thereby being placed over sidewalls of the lower switching transistor SW0 and the bulk layer. The gate oxide film over the sidewall of the bulk layer is removed by, for example, recess etching (FIG. 9b).

Figure 9C:
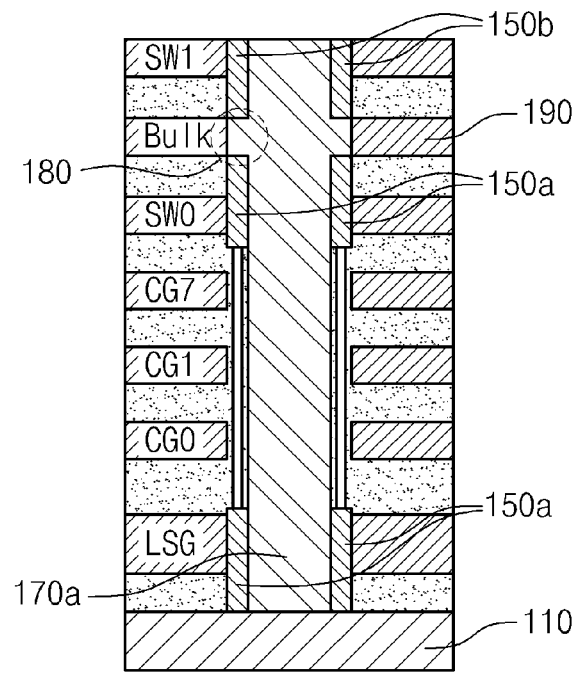

Channel polysilicon is filled in the space in such a manner that it comes into direct contact with the bulk layer to form a protrusion 180. The upper surface of the resulting structure is planarized, and then the upper switching transistor SW1 and the gate insulating film 150b are formed thereon. and channel polysilicon fills in an upper space, thereby forming a structure shown as shown in FIG. 9c.

Figure 9D:
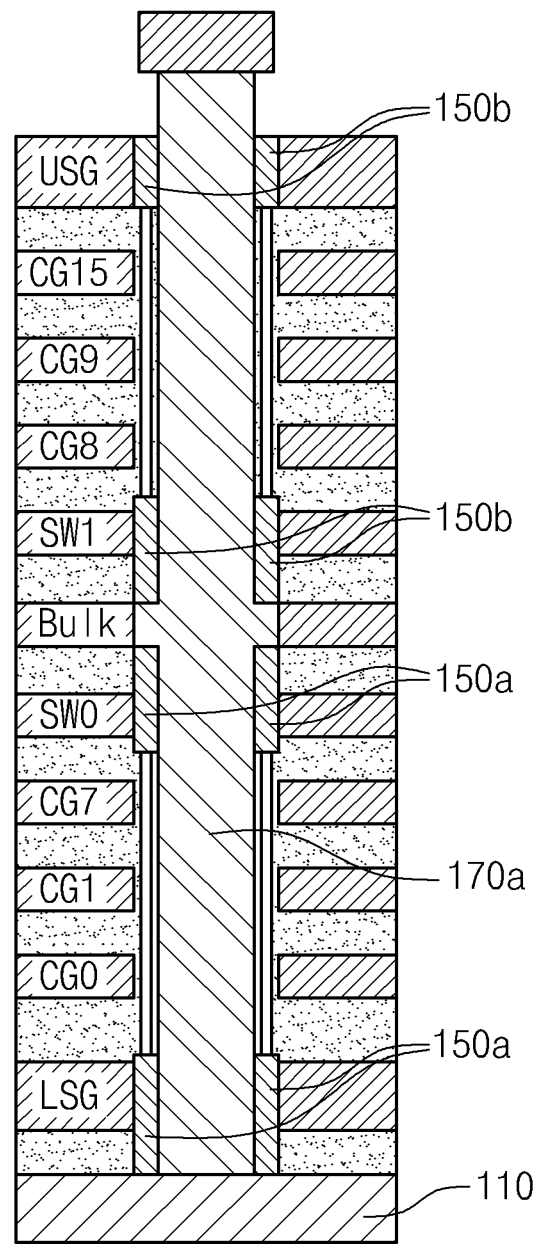

Then, the processes shown in FIGS. 8g to 8l are repeated, thereby forming a structure as shown in FIG. 9d. Although this fabrication process is complex compared to the process shown in the FIG. 8, it has an advantage in that there is no charge trap film in the lower switching transistor SW0.

Embodiment 2

The same objective of the embodiment can be achieved by increasing a thicknesses of the insulating layers on and under the bulk layer 190, instead of forming the upper and lower switching transistors. See FIG. 10. In an erasing operation, the conductive gate layers, particularly CG7 and CG8 adjacent to the bulk layer 190 may experience an interference phenomenon. In order to prevent this phenomenon, in Embodiment 1, the electric field screening effect of the upper and lower switching transistor is used. In Embodiment 2, thicknesses of the interlayer insulating films are increased, instead of forming the switching transistors. The electric fields between the bulk layer 190 and the conductive gate layers CG7 and CG8 decreases as thicknesses of dielectric material (i.e., interlayer insulating film) therebetween increases.

Thus, the interference phenomenon also decreases. As shown in FIG. 10, thicknesses T1 of the insulating layers directly on and directly under the bulk layer 190 are much greater than thicknesses T2 of the remaining insulating layers located farther from the bulk layer 190. The order of processes in Embodiment 2 is similar to that in Embodiment 1, except for the processes for forming the upper and lower switching transistors and the gate insulating layers, and thus the detailed description of the processes is omitted.

Embodiment 3

Figure 11:
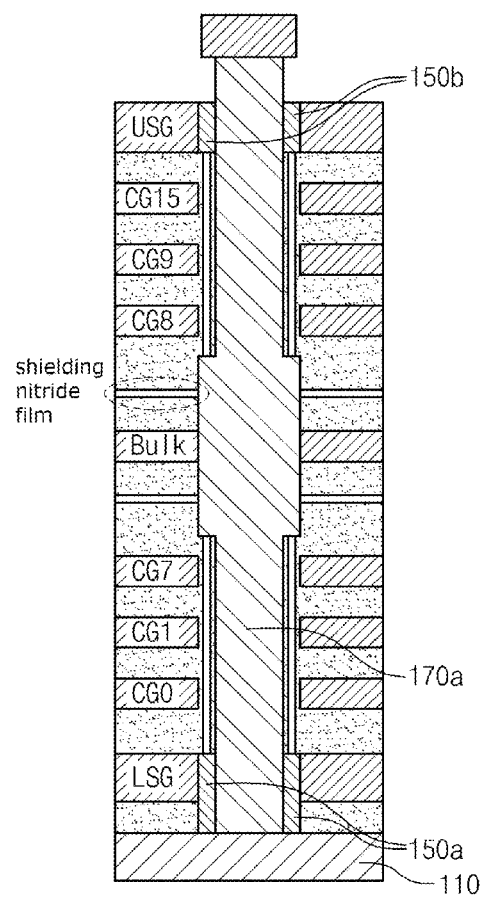
FIG. 11 shows Embodiment 3.

Still another embodiment is directed to use of a shielding nitride film. As shown in FIG. 11, a shielding nitride film is inserted between the bulk layer 190 and the memory cells CG7 and CG8. The nitride film also performs an excellent role in screening electric fields, due to the properties of the material.

Several embodiments are not exclusive from each other, and thus can be combined. For example, (i) a combination of Embodiments 1 and 2, or (ii) a combination of Embodiments 2 and 3 is possible. In addition thereto, other combination may also be possible.

Relationship Between Bulk Layer and Channel Layer During Erasing Operation

Figure 12A:
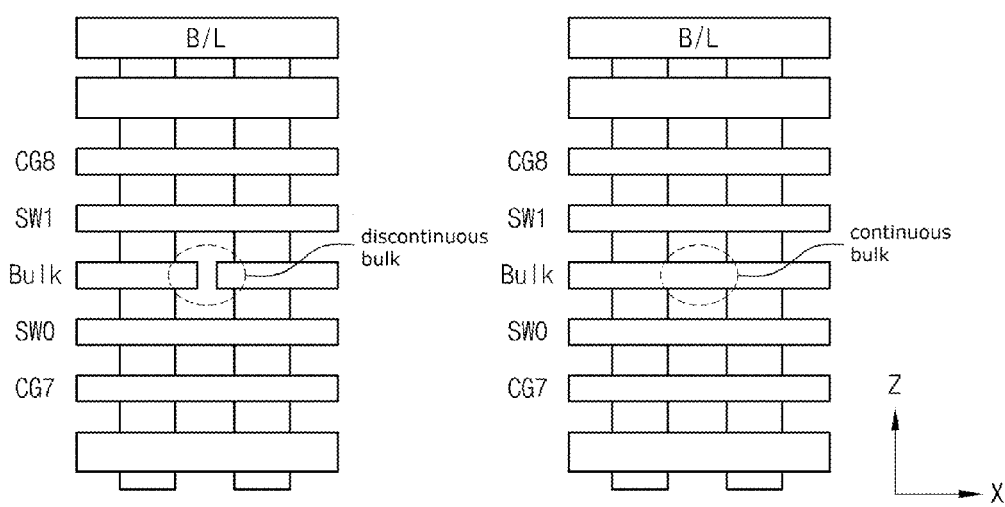
FIG. 12a is a cross-sectional view showing each of a non-continuous bulk structure and a continuous bulk structure according to an embodiment.

Even if the P$^+$-doped bulk layer and the P-doped channel layer come into contact with each other, a depletion region is present between the two layers due to the difference in the doping concentration, and thus an electric current cannot flow between the two layers when no bias is applied. In addition, in the embodiment, the bulk layer performs an erase operation, and thus a reverse bias is applied between the two layers during the erase operation. In this case, a flow of a reverse saturation current between the two layers is further reduced. The bulk layer may be formed of a single body and coupled to two or more neighboring NAND strings. See FIG. 12a (at right). Alternatively, the bulk layer may include a plurality of discontinuous portions. FIG. 12a (at left) shows cross-sectional views of a structure in which a plurality of bulk layers are present at a given integration level. Each of the plurality of bulk is coupled to a single NAND string.

Figure 12B:
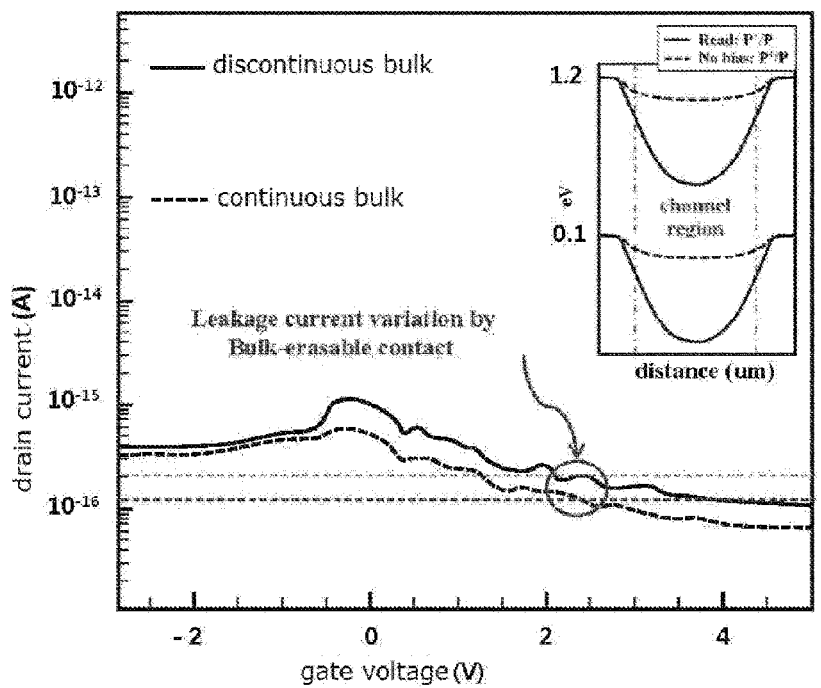

FIG. 12b shows gate voltage-drain current characteristics of the above two structures. As shown in FIG. 12b, an electric current lower than $10^{-15}$ ampere (A) flows in the two structures. Electric current is lower in the structure having the continuous bulk region. Thus, it can be seen that flows of an electric current in the structure having the discontinuous bulk region and the structure having the continuous bulk region are negligible, indicating that electrical interference during the operation of the memory cells is minimized.

For reference, the enlarged figures inserted in the upper right side FIG. 12b shows the results of simulating potential of the channel layer in the X-direction under a read condition and a bias of 0.

Protrusion of Channel Layer

Figure 13:
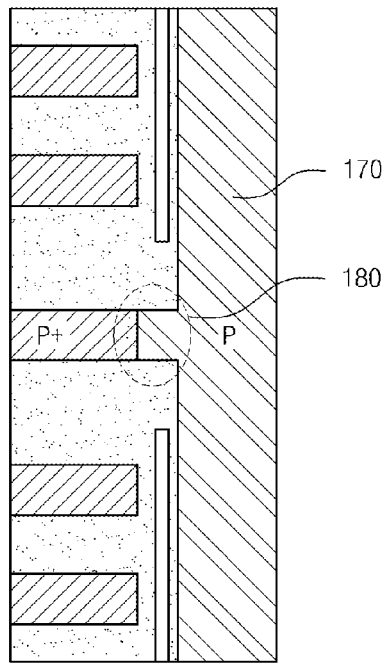
FIG. 13 is an enlarged cross-sectional view of a protrusion of a channel layer.

The channel layer extending vertically along the direction in which the NAND string extends has a protrusion near the bulk region. That is, the channel layer has a greater width at an integration level where the bulk layer is located. FIG. 13 is an enlarged view of the protrusion. In the embodiment, the protrusion 180 plays an important role. Due to the difference in doping concentration between the bulk layer and the channel layer, a depletion region between the two layers is mostly formed in the channel layer. If the protrusion 180 is not present, the depletion region will be formed in the vertical channel layer, and an effective width of the channel near the bulk layer will be reduced (channel narrowing effect). If the width of the channel is reduced, the channel resistance in the horizontal direction will increase, resulting in a decrease in the channel current. Due to the presence of the protrusion 180, the depletion region is formed in the protrusion region, and the resistance of the vertical channel is maintained at a constant level even near the bulk layer.

Prevention of Change of Threshold Voltage

As described above, in memory cells adjacent to the bulk layers, for example, CG7 and CG8 in FIG. 1, threshold voltages of the transistors CG7 and CG8 may change in an unintended manner due to a capacitive coupling between the bulk layer and the transistors CG7 and CG8. Three methods for preventing this unwanted change have been presented above, and the embodiments thereof have been described in detail above.

Hereinafter, the three embodiments will further be described. The first embodiment is directed to the use of the switching transistors SW0 and SW1. The conductive layers serving as the gates of the switching transistors SW0 and SW1 screen an electric field applied from the conductive layer of CG7 or CG8 to the bulk layer or from the bulk layer to the conductive layer to thereby electrically insulate the two conductive layers.

Figure 15:
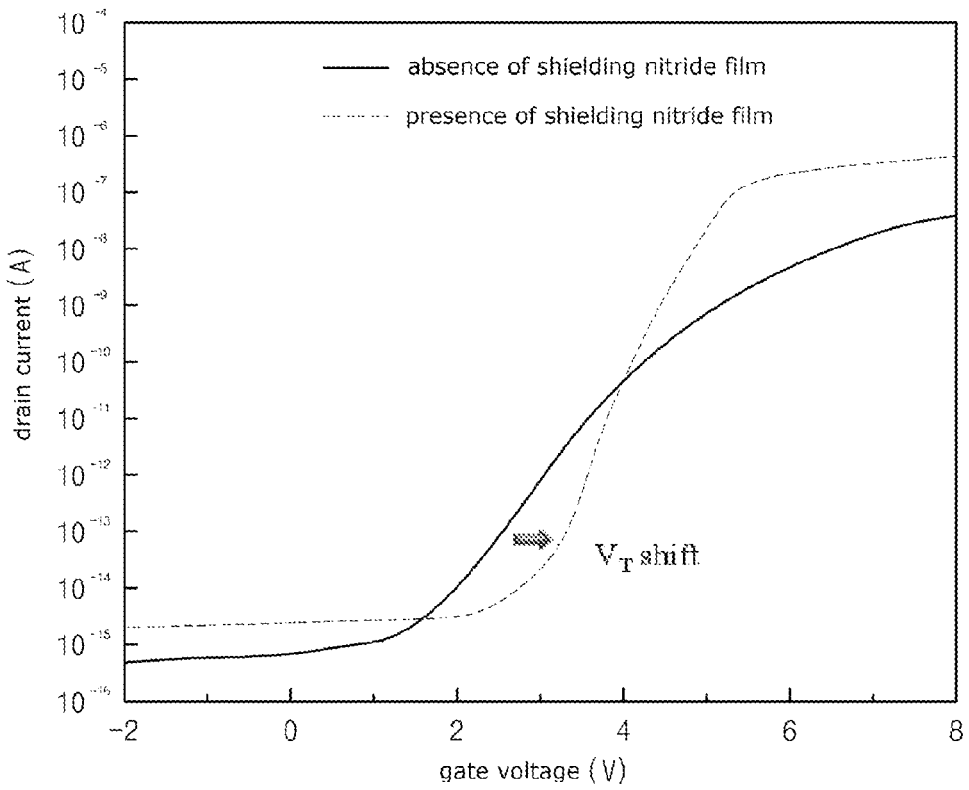
FIG. 15 shows the results of testing effects of a shielding nitride film.

The second embodiment is directed to minimizing the interference phenomenon by controlling the thicknesses of the insulating layers as shown in FIG. 10. The third embodiment is directed to insertion of the shielding film as shown in FIG. 11. It is relatively simple to form the nitride film. The process for forming the nitride film may be performed before and/or after forming the bulk layer. Formation of the nitride film may be performed using a generally known process for forming nitride films. A nitride film present near at the level where the protrusion is located also functions to shield an electric field. Benefits of employment of the nitride film to prevent threshold voltage changes are clearly shown from the voltage-current characteristics of FIG. 15. When the shielding nitride film is not present, the slope of the current curve is slow. Thus, the change of threshold voltage over a broad range. However, when the shielding nitride film is present, the slope of the current curve is rapid, and the change of threshold voltage is also within a narrow range.

Formation of a Plurality of NAND Strings

Although the foregoing is directed to the method of forming the first NAND string (lower NAND string) on the semiconductor substrate and forming the second NAND string (upper NAND string) thereon and the structure formed by the method, a plurality of NAND strings, including third and fourth NAND strings, may be formed using the above method. After one NAND string has been formed, the bulk layer is planarized, and other NAND strings are stacked on the planarized bulk layer in a manner similar to the method of forming the first NAND string.

Nonvolatile Memory Controller

Figure 16:
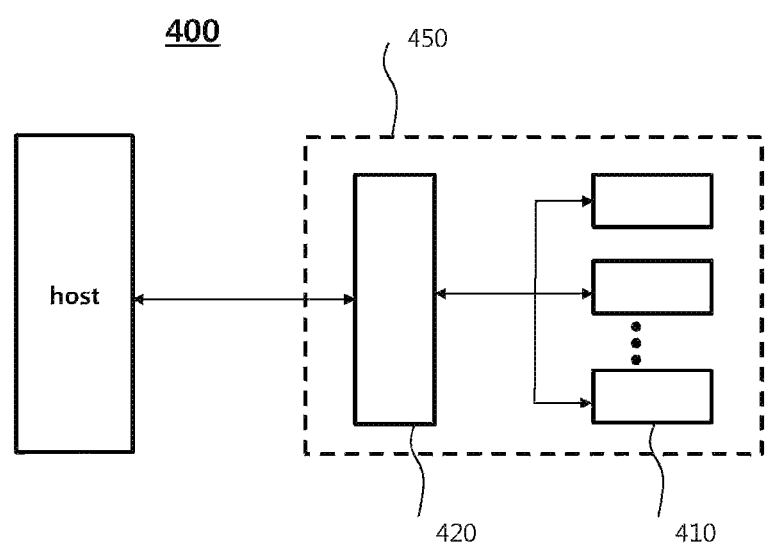
FIG. 16 is a block diagram showing a system comprising (i) a nonvolatile memory device of an embodiment, (ii) a memory card including the nonvolatile memory device, and (iii) a host.

When the above-described memory cell structure is formed together with a peripheral circuit, a single nonvolatile memory cell is obtained. This nonvolatile memory device may be used alone or combined with one or more memory controllers to provide a nonvolatile memory card. FIG. 16 shows the use of the nonvolatile memory device. As shown therein, a plurality of individual nonvolatile memory devices 410 are combined with one or more memory controllers 420 to form a nonvolatile memory card 450. The memory controller 420 functions to control the operation (such as reading, writing or erasing) of the nonvolatile memory device 410. In mutual communication, the exchange of address information, exchange of commands related to reading, writing and erasing, exchange of binary information, and the like are performed in the nonvolatile memory card 450.

The nonvolatile memory card 450 may be a portion of a system 400 connected with a microprocessor, often called "host". Connection of the system with the host can be performed using various methods. For example, a protocol such as USB (Universal Serial Bus) may be used. In addition, various methods such as SATA or Bluetooth may also be used.

According to an embodiment, the erasing operation in the vertical channel-type nonvolatile memory device can be more effectively executed. Particularly, it is possible to reduce resistance of the vertical channel that increases as the number of vertically stacked memory cells increases. Thus, the erasing operation can be executed regardless of the number of the vertically stacked layers.

Moreover, because the erasing bulk layer is located between the plurality of NAND strings, the stacking process is easily performed even when the NAND strings are repeated vertically.

In addition, even when the erasing bulk layer and the channel layer come into direct contact with each other, the effective width of the channel layer is not reduced because the channel layer has a protrusion.

In addition to the embodiments described above, various changes and modifications may be made without departing from the spirit and scope of the embodiments.

What is claimed is:

1. A nonvolatile memory device comprising:
   a semiconductor substrate;
   a first NAND string extending in a first direction and comprising a plurality of memory cells, wherein the first NAND string further comprises (i) a stacked structure in which one or more interlayer insulating layers and one or more conductive gate layers are repeatedly and alternately formed over the semiconductor substrate, (ii) a gate insulating layer and a composite insulating layer formed over a sidewall of the stacked structure, and (iii) a channel layer extending in the first direction which is perpendicular to an upper surface of the semiconductor substrate;
   a second NAND string formed over the first NAND string and extending in the first direction;
   an erasing bulk layer located between the first NAND string and the second NAND string and including a conductive semiconductor material; and
   a protrusion extending from the channel layer in a second direction different from the first direction, the protrusion coupled to the erasing bulk layer and having a doping concentration different from that of the erasing bulk layer.

2. The nonvolatile memory device of claim 1, wherein each of the first and the second NAND strings includes a select transistor for selecting the memory cells, and
   wherein the select transistor is connected in series with the memory cells.

3. The nonvolatile memory device of claim 1, wherein a switching transistor is formed (i) between the erasing bulk layer and the first NAND string, (ii) between the erasing bulk layer and the second NAND string, or both.

4. The nonvolatile memory device of claim 1, wherein a shielding nitride film is formed (i) between the erasing bulk layer and the first NAND string, (ii) between the erasing bulk layer and the second NAND string, or both.

5. The nonvolatile memory device of claim 1, wherein a thickness of an interlayer insulating layer insulating the erasing bulk layer, is greater than a thickness of an interlayer insulating layer insulating the conductive gate layer.

6. The nonvolatile memory device of claim 1, wherein the protrusion is directly coupled to the erasing bulk layer and has the doping concentration lower than that of the erasing bulk layer.

7. The nonvolatile memory device of claim 2, wherein the select transistor is coupled to a bit line.

8. A nonvolatile memory device comprising:
   a semiconductor substrate;
   a first NAND string extending in a first direction and comprising (i) a first stack including an interlayer insulating layer and a conductive gate layer and formed over the semiconductor substrate, (ii) a first composite insulating layer formed in the first direction and further formed over a sidewall of a first space created by patterning the first stack, and (iii) a first channel layer filled in the first space;
   an erasing conductive gate layer provided over the first NAND string;
   a second NAND string extending in the first direction, provided over the erasing conductive gate layer, and including (i) a second stack including a second interlayer insulating layer and a second conductive gate layer and formed over the first NAND string, (ii) a second composite insulating layer formed in the first direction and further formed over a sidewall of a second space created by patterning the second stack, and (iii) a second channel layer filled in the second space; and
   a protrusion extending from between the first and the second channel layers in a second direction and coupled to the erasing conductive gate layer.

9. The nonvolatile memory device of claim 8, wherein the first channel layer and the second channel layer are coupled to each other.

10. The nonvolatile memory device of claim 8, wherein the erasing conductive layer has a doping concentration higher than the first channel layer and the second channel layer.

11. The nonvolatile memory device of claim 8, wherein any of the first composite insulating layer and the second composite insulating layer includes nitride.

12. The nonvolatile memory device of claim 8, wherein any of the first composite insulating layer and the second composite insulating layer are configured to store data.

13. The nonvolatile memory device of claim 8, wherein the first space and the second space are formed by using substantially the same photomask.

14. A nonvolatile memory device comprising:
   a semiconductor substrate;
   a channel formed over the substrate and extending in a first direction;
   a first NAND string arranged over a lower portion of a sidewall of the channel;
   a second NAND string arranged over an upper portion of the sidewall of the channel;
   an erasing conductive layer provided between the first and the second NAND strings and coupled to the sidewall of the channel; and
   a select transistor provided between the erasing conductive layer and the first NAND string, or between the erasing conductive layer and the second NAND string.

15. The nonvolatile memory device of claim 14, the device further comprising:
   a protrusion extending from the sidewall of the channel to between the first and the second NAND strings,
   wherein the erasing conductive layer is coupled to the protrusion.

16. The nonvolatile memory device of claim 14,
   wherein each of the first and the second NAND strings includes a plurality of control gates coupled to the channel via a plurality of charge trap layers, respectively.

17. The nonvolatile memory device of claim 16,
   wherein the plurality of control gates and the plurality of charge trap layers extend in a second direction perpendicular to the first direction.

18. The nonvolatile memory device of claim 16,
   wherein a thickness of a first interlayer insulating layer insulating the erasing conductive layer is greater than a thickness of a second interlayer insulating layer insulating the plurality of control gates from each other.

* * * * *